(12) United States Patent
Yasui et al.

(10) Patent No.: US 9,028,191 B2
(45) Date of Patent: May 12, 2015

(54) SUBSTRATE PROCESSING APPARATUS AND METHOD OF MANUFACTURING SEMICONDUCTOR DEVICE

(75) Inventors: Takeshi Yasui, Toyama (JP); Yukitomo Hirochi, Toyama (JP); Satoshi Takano, Toyama (JP); Ritsuo Horii, Toyama (JP); Makoto Kawabata, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 40 days.

(21) Appl. No.: 13/163,165

(22) Filed: Jun. 17, 2011

(65) Prior Publication Data

US 2011/0311339 A1    Dec. 22, 2011

(30) Foreign Application Priority Data

Jun. 17, 2010   (JP) ................................. 2010-138524

(51) Int. Cl.
*H01L 21/67* (2006.01)
*H01J 37/32* (2006.01)

(52) U.S. Cl.
CPC ..... *H01L 21/67196* (2013.01); *H01J 37/32743* (2013.01); *H01J 37/32788* (2013.01); *H01J 37/32889* (2013.01); *H01J 37/32899* (2013.01); *H01L 21/67201* (2013.01)

(58) Field of Classification Search
USPC .......................................... 414/941; 294/213
See application file for complete search history.

(56) References Cited

U.S. PATENT DOCUMENTS

| | | | | |
|---|---|---|---|---|
| 5,252,807 A | * | 10/1993 | Chizinsky | 219/390 |
| 5,609,689 A | * | 3/1997 | Kato et al. | 118/719 |
| 5,882,165 A | * | 3/1999 | Maydan et al. | 414/217 |
| 6,059,507 A | * | 5/2000 | Adams | 414/217 |
| 6,309,161 B1 | * | 10/2001 | Hofmeister | 414/221 |
| 6,440,178 B2 | * | 8/2002 | Berner et al. | 29/25.01 |
| 6,478,532 B1 | * | 11/2002 | Coady et al. | 414/783 |
| 6,607,380 B1 | * | 8/2003 | Nakazato | 432/243 |
| 6,688,375 B1 | * | 2/2004 | Turner et al. | 165/48.1 |
| 7,316,966 B2 | * | 1/2008 | Kurita et al. | 438/478 |
| 7,665,951 B2 | * | 2/2010 | Kurita et al. | 414/805 |
| 8,272,825 B2 | * | 9/2012 | Hofmeister et al. | 414/217 |

FOREIGN PATENT DOCUMENTS

| | | |
|---|---|---|
| JP | 2002-373890 | 12/2002 |
| JP | 2003-100835 | 4/2003 |

* cited by examiner

*Primary Examiner* — James Keenan
(74) *Attorney, Agent, or Firm* — Volpe and Koenig, P.C.

(57) ABSTRACT

Reduction in cooling rate of a substrate having a lower temperature is suppressed because the substrate having a lower temperature is not affected by radiant heat of a substrate having a higher temperature while cooling a plurality of substrates in a cooling chamber. The substrate processing apparatus includes a load lock chamber configured to accommodate stacked substrates; a first transfer mechanism having a first transfer arm provided with a first end effector, and configured to transfer the substrates into/from the load lock chamber at a first side of the load lock chamber; a second transfer mechanism having a second transfer arm provided with a second end effector, and configured to transfer the substrates into/from the load lock chamber at a second side of the load lock chamber; a barrier installed between the substrates to be spaced apart from the substrates supported by a substrate support provided in the load lock chamber; and an auxiliary barrier unit installed between the substrate support and the barrier, wherein the auxiliary barrier unit is installed at places other than standby spaces of the end effectors.

17 Claims, 18 Drawing Sheets

SUBSTRATE PROCESSING APPARATUS AND METHOD OF MANUFACTURING SEMICONDUCTOR DEVICE

CROSS-REFERENCE TO RELATED PATENT APPLICATION

This application claims priority to and the benefit of Japanese Patent Application No. 2010-138524 filed on Jun. 17, 2010, the disclosure of which is incorporated herein by reference.

1. FIELD OF THE INVENTION

The present invention relates to a substrate processing apparatus and a method of manufacturing a semiconductor device.

2. DESCRIPTION OF THE RELATED ART

A conventional substrate processing apparatus in which one process of a method of manufacturing a semiconductor device is performed includes a process chamber configured to process a substrate, a transfer chamber connected to the process chamber, a transfer mechanism installed in the transfer chamber and configured to transfer the substrate between the transfer chamber and the process chamber, and a load lock chamber configured to accommodate a plurality of substrates, which are connected to the transfer chamber, in multiple stages. Then, the substrate processed in the process chamber is transferred into the load lock chamber via the transfer chamber by means of the transfer mechanism, and cooled therein.

SUMMARY OF THE INVENTION

However, the processed substrate transferred into the load lock chamber is maintained at a high temperature. Therefore, when a processed second substrate of a high temperature is further transferred into the load lock chamber while a processed first substrate previously transferred into the load lock chamber is cooled, the first substrate is heated by radiant heat from the second substrate. Therefore, as a cooling rate of the first substrate is reduced, it takes longer to cool the first substrate. Also, when the second substrate having a lower temperature than the first substrate previously loaded into the load lock chamber is loaded into the load lock chamber, the second substrate is heated by radiant heat of the first substrate, thus increasing the time it takes to cool the second substrate.

Accordingly, an object of the present invention is to provide a substrate processing apparatus capable of reducing an effect of radiant heat from a high temperature substrate on a low temperature substrate and preventing reduction in a cooling rate of the low temperature substrate when a plurality of substrates are cooled in a cooling chamber.

According to one embodiment of the present invention, there is provided a substrate processing apparatus including: a load lock chamber configured to accommodate stacked substrates including at least a first substrate and a second substrate; a first transfer mechanism having a first transfer arm provided with a first end effector having two fingers at a front end thereof, and configured to transfer the substrates into/from the load lock chamber at a first side of the load lock chamber; a second transfer mechanism having a second transfer arm provided with a second end effector having two fingers at a front end thereof, and configured to transfer the substrates into/from the load lock chamber at a second side of the load lock chamber; a barrier installed between the substrates supported by a substrate support provided in the load lock chamber, the barrier being spaced apart from each of the substrates; and an auxiliary barrier unit installed between the substrate support and one of the barrier and a bottom wall of the load lock chamber so as to be interposed between the fingers of the first end effector while the first end effector stays in a standby space, wherein the barrier includes therein a channel through which a cooling medium flows.

According to another embodiment of the present invention, there is provided a substrate processing apparatus including: a load lock chamber configured to accommodate at least an upper substrate and a lower substrate vertically stacked; a first transfer mechanism having a first transfer arm provided with a first end effector with two fingers, and configured to load and unload the upper substrate into and from the load lock chamber at a first side of the load lock chamber; a second transfer mechanism having a second transfer arm provided with a second end effector, and configured to load and unload the lower substrate into and from the load lock chamber at a second side of the load lock chamber; a barrier installed between the upper substrate and the lower substrate accommodated in the load lock chamber, the barrier being spaced apart from the upper substrate and the lower substrate; a first auxiliary barrier unit installed between the upper substrate accommodated in the load lock chamber and the barrier, the first auxiliary barrier unit being installed at a height such that the first auxiliary barrier unit is between the two fingers of the first end effector when loading and unloading the upper substrate; and a second auxiliary barrier unit installed under the lower substrate accommodated in the load lock chamber.

The substrate processing apparatus of the present invention can reduce an effect of radiant heat from a high temperature substrate on a low temperature substrate, thus preventing reduction in a cooling rate of the low temperature substrate when a plurality of substrates are cooled in a cooling chamber.

DETAILED DESCRIPTION OF THE PREFERRED EMBODIMENTS

First Embodiment of the Present Invention

Hereinafter, a configuration of a substrate processing apparatus according to a first embodiment of the present invention, a substrate processing steps using the substrate processing apparatus, a method of processing a substrate and a method of manufacturing a semiconductor device will be described.

(1) Configuration of Substrate Processing Apparatus

Figure 1:
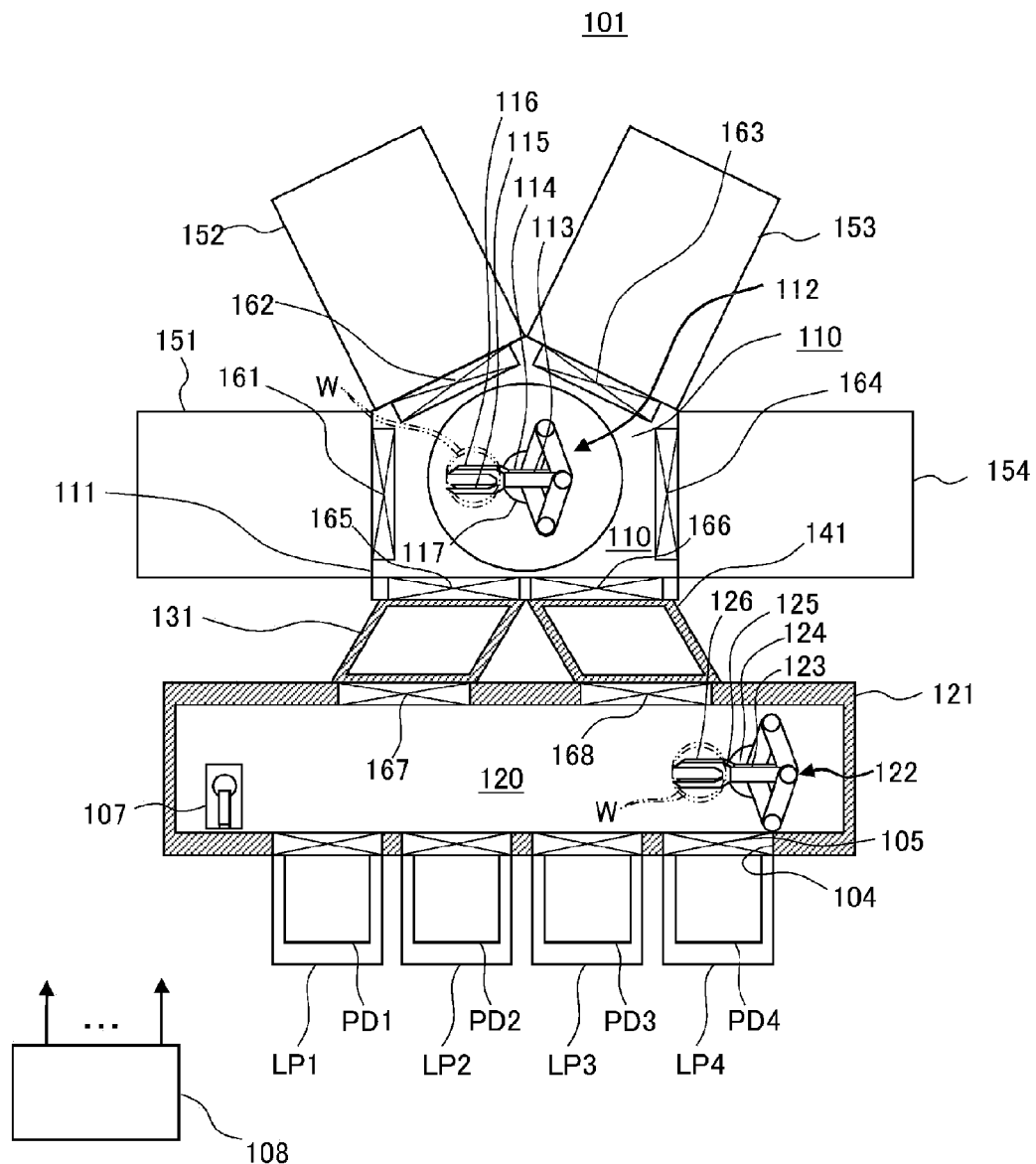
FIG. 1 is a top cross-sectional view illustrating an outline configuration of a cluster-type substrate processing apparatus according to a first embodiment of the present invention.
Figure 2:
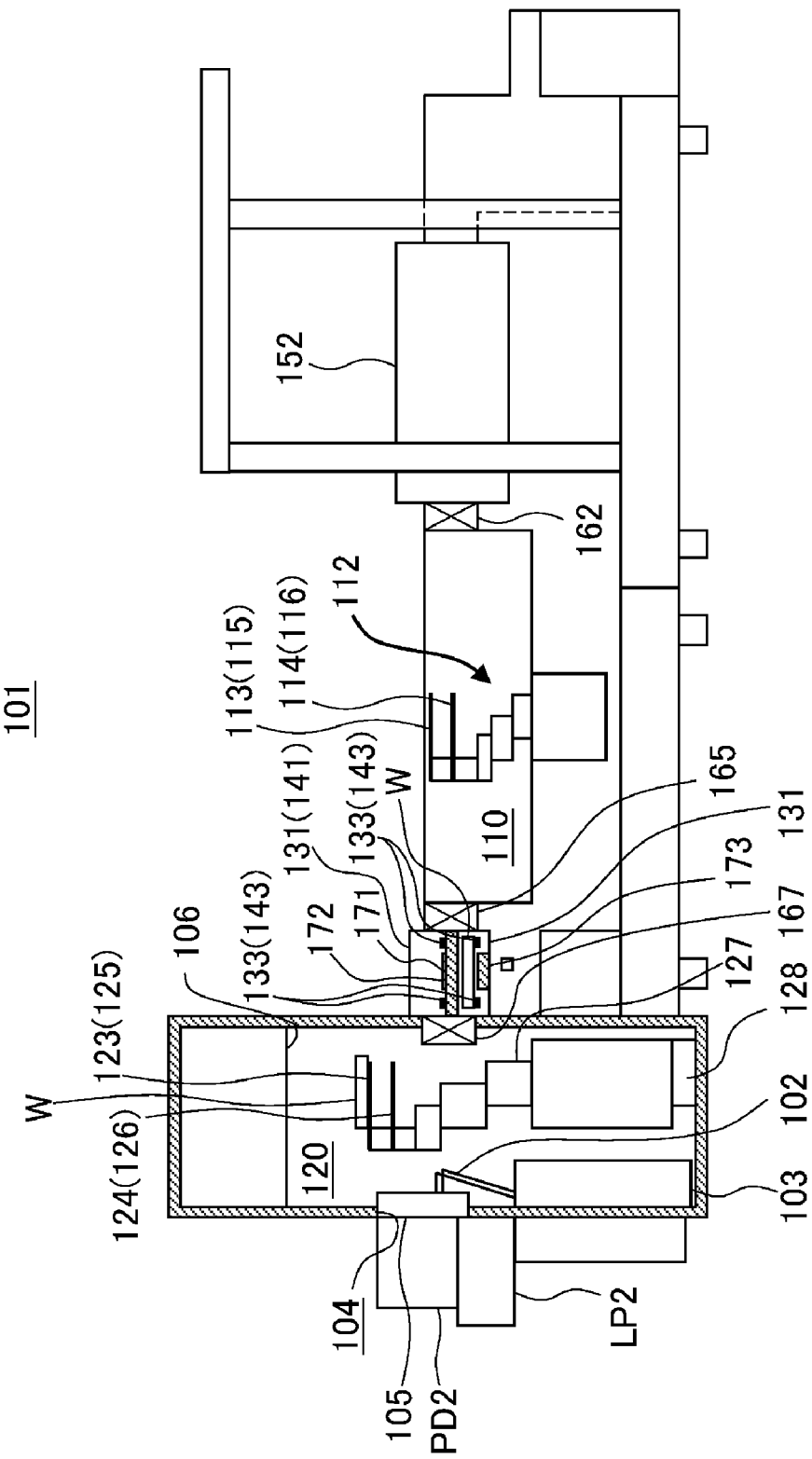
FIG. 2 is a side cross-sectional view illustrating an outline configuration of the substrate processing apparatus according to the first embodiment of the present invention.

First, the configuration of the substrate processing apparatus according to the first embodiment of the present invention will be described with reference to FIGS. 1 and 2. FIG. 1 is a top cross-sectional view illustrating an outline configuration of a cluster-type substrate processing apparatus according to the first embodiment of the present invention. FIG. 2 is a side cross-sectional view illustrating an outline configuration of the substrate processing apparatus according to the first embodiment of the present invention, for example, a cross-sectional view illustrating a configuration spanning from a process chamber 152 to a load port LP2.

The cluster-type substrate processing apparatus according to this embodiment is divided into a vacuum side and an atmosphere side. In this specification, the term "vacuum" refers to an industrial vacuum.

(Configuration of Vacuum Side)

A vacuum transfer chamber 110 serving as a first transfer chamber that can be vacuum-airtight, a load lock chamber 131, a load lock chamber 141 and process chambers 151, 152, 153 and 154 configured to process a wafer W as a substrate are installed at the vacuum side of the cluster-type substrate processing apparatus. The load lock chamber 131, the load lock chamber 141 and the process chambers 151 through 154 are arranged in a star-like shape (cluster-type shape) at a periphery of the vacuum transfer chamber 110.

The vacuum transfer chamber 110 is configured in a load lock chamber structure which can endure a pressure (reduced pressure) lower than atmospheric pressure such as a vacuum state. According to this embodiment, a planar view of a housing 111 of the vacuum transfer chamber 110 is also formed in a pentagonal shape, for example a box shape with its upper and lower ends closed. Therefore, the load lock chamber 131 and the load lock chamber 141 are installed at one of sidewalls constituting the housing 111 of the vacuum transfer chamber 110, and the process chambers 151 through 154 are installed at the four other sidewalls.

A vacuum transfer robot 112 serving as a first transfer mechanism is installed in the vacuum transfer chamber 110. The vacuum transfer robot 112 includes a first transfer arm 113 and a second transfer arm 114, both of which may transfer two wafers W (shown by a two-dot chain line in the drawing) concurrently. The vacuum transfer robot 112 is configured to put the wafer W on a first end effector 115 and a second end effector 116, which constitute ends of the first transfer arm 113 and the second transfer arm 114, respectively, and transfer the wafer W between "the load lock chamber 131 and the load lock chamber 141", and "the process chambers 151 through 154". Also, each of the first end effector 115 and the second end effector 116 includes fingers configured to support the wafer W. In this embodiment, each of the first end effector 115 and the second end effector 116 is configured in a bipartite shape in which a front end is divided into two parts, and includes 2 fingers. Also, the vacuum transfer robot 112 is configured to go up and down by means of an elevator 117 while maintaining air tightness in the vacuum transfer chamber 110. Also, a wafer presence sensor (not shown) serving as a substrate detection unit configured to detect the presence of the wafer W is installed in a predetermined position (for example, in the vicinity of a gate valve) in front of the load lock chamber 131, the load lock chamber 141 and the process chambers 151 through 154.

The process chambers 151 through 154 are configured to process the wafer W by performing a process of forming a thin film on the wafer W, a process of forming an oxide film or a nitride film on a surface of the wafer W, or a process of forming a metal thin film or a metal compound thin film on the surface of the wafer W, for example, using a chemical vapor deposition (CVD) method, an atomic layer deposition (ALD) method or a physical vapor deposition (PVD) method. A gas supply source (not shown), a gas introduction mechanism having a valve and a mass flow controller (MFC) configured to control a flow rate of a process gas supplied from the gas supply source, a gas exhaust mechanism having an automatic pressure controller (APC) and a pressure sensor (not shown) configured to control a pressure in the process chambers 151 through 154, a temperature regulator (not shown) configured to control a temperature in the process chambers 151 through 154, an input/output valve I/O configured to control a supply of a process gas (not shown) or an On/Off operation of an exhaust valve, and a plasma discharge mechanism configured to supply high-frequency electric power to generate plasma in the process chambers 151 through 154 are installed at the process chambers 151 through 154.

The process chambers 151 through 154 may be the same kinds of process furnaces, or may be different kinds of process furnaces according to a processing purpose. In the description of this embodiment, the same kinds of process furnaces will be described hereinafter. Also, the details of the process furnaces will be described later.

The process chambers 151 through 154 are connected to the vacuum transfer chamber 110 via a gate valve 161, a gate valve 162, a gate valve 163 and a gate valve 164, respectively.

The load lock chamber 131 and the load lock chamber 141 are configured to communicate with the vacuum transfer chamber 110 via a gate valve 165 and a gate valve 166, respectively. Also, the load lock chamber 131 and the load lock chamber 141 are configured to communicate with an atmosphere transfer chamber 120 serving as a second transfer chamber (to be described later) via a gate valve 167 and a gate valve 168, respectively.

Each of the load lock chamber 131 and the load lock chamber 141 is configured to have a load lock chamber structure which can endure a reduced pressure lower than atmospheric pressure such as a vacuum state, and vacuum-exhaust an inner atmosphere of the load lock chamber structure. Therefore, the load lock chamber 131, the load lock chamber 141 and the vacuum transfer chamber 110 may hold a vacuum state by closing the gate valves 165 through 168, exhausting inner atmosphere of the load lock chamber 131 and the load lock chamber 141 and opening the gate valve 165 and the gate valve 166. The wafer W may be transferred to the load lock chamber 131, or may be transferred between the load lock chamber 141 and the vacuum transfer chamber 110.

The load lock chamber 131 and the load lock chamber 141 serve as spare chambers configured to temporarily accommodate the wafer W when the wafer W is transferred into the vacuum transfer chamber 110, and, in addition to the spare chambers, serve as cooling chambers configured to unload the wafer W from the vacuum transfer chamber 110 and temporarily accommodate and cool the wafer W. In this case, the wafer W is placed on a substrate support 133 in the load lock chamber 131 and placed on a substrate support 143 in the load lock chamber 141. Also, configurations of the load lock chamber 131 and the load lock chamber 141, and cooling operations in the load lock chamber 131 and the load lock chamber 141 will be described later.

(Configuration of Atmosphere Side)

In addition, an atmosphere transfer chamber 120 serving as a second transfer chamber connected to the load lock chamber 131 and the load lock chamber 141, and load ports LP1 through LP4 connected to the atmosphere transfer chamber 120 are installed at the atmosphere side of the cluster-type substrate processing apparatus. Therefore, the load lock chamber 131 and the load lock chamber 141 are installed on a transfer path of the wafer W spanning from the process chambers 151 through 154 to the atmosphere transfer chamber 120.

A clean air unit 106 (see FIG. 2) configured to supply clean air is installed at the atmosphere transfer chamber 120.

Pods PD1 through PD4 serving as substrate accommodation containers are configured to be placed on the load ports LP1 through LP4. A plurality of slots (not shown) serving as accommodation units configured to accommodate the wafer W are installed in the pods PD1 through PD4, respectively.

One atmosphere transfer robot 122 serving as a second transfer mechanism is installed in the atmosphere transfer chamber 120. A third transfer arm 123 and a fourth transfer arm 124, which may transfer two wafers W (shown by a two-dot chain line in the drawing), are installed at the atmosphere transfer robot 122. The atmosphere transfer robot 122 is configured to put the wafer W on a third end effector 125 and a fourth end effector 126, which constitute ends of the third transfer arm 123 and the fourth transfer arm 124, respectively, and transfer the wafer W between the load lock chamber 131 and the load lock chamber 141, and the pods PD1 through PD4 placed on the load ports LP1 through LP4. Also, the atmosphere transfer robot 122 is configured to go up and down by means of an elevator 127, and reciprocate in left and right directions (in left and right directions as shown in FIG. 1 and in front and rear directions as shown in FIG. 2) by a linear actuator 128 serving as a movement device. Also, a wafer presence sensor (not shown) serving as a substrate detection unit configured to detect the presence of the wafer W is installed in a predetermined position (for example, in the vicinity of a gate valve) in front of the atmosphere transfer chamber 120.

Also, a notch adjusting device 107 serving as a substrate position correction device and configured to perform positional adjustment of a crystal orientation of the wafer W using a notch formed on the wafer W is installed in the atmosphere transfer chamber 120. Instead of the notch adjusting device 107, an orientation flat adjusting device (not shown) configured to perform the positional adjustment of the crystal orientation of the wafer W may be installed.

A wafer transfer port 104 configured to load and unload the wafer W with respect to the atmosphere transfer chamber 120 is formed in a housing 121 of the atmosphere transfer chamber 120. The above-described load ports LP1 through LP4 configured to place the pods PD1 through PD4 configured to accommodate a plurality of wafers W are provided outside the housing 121 of the atmosphere transfer chamber 120 and in a lower portion of the wafer transfer port 104. Also, an opening/closing mechanism 102 configured to perform opening/closing operations of a lid 105 configured to open and close the wafer transfer port 104 and caps (not shown) of the pods PD1 through PD4 placed on the load ports LP1 through LP4, and an opening/closing mechanism drive unit 103 configured to drive the opening/closing mechanism 102 are provided in the atmosphere transfer chamber 120. Generally, pod openers are configured as the opening/closing mechanism 102 and the opening/closing mechanism drive unit 103. Therefore, as the caps (not shown) installed respectively at the pods PD1 through PD4 and the lid 105 configured to close the wafer transfer port 104 are opened and closed by the opening/closing mechanism 102, the wafer W may be loaded and unloaded with respect to the pods PD1 through PD4. Also, the pods PD1 through PD4 may be transferred and unloaded with respect to the load ports LP1 through LP4 using an in-process transfer device (AGV/OHT, not shown).

(Control Unit)

The substrate processing apparatus 101 is provided with a control unit 108 configured to control operations of the above-described parts.

(First Example of Process Furnace)

Figure 3:
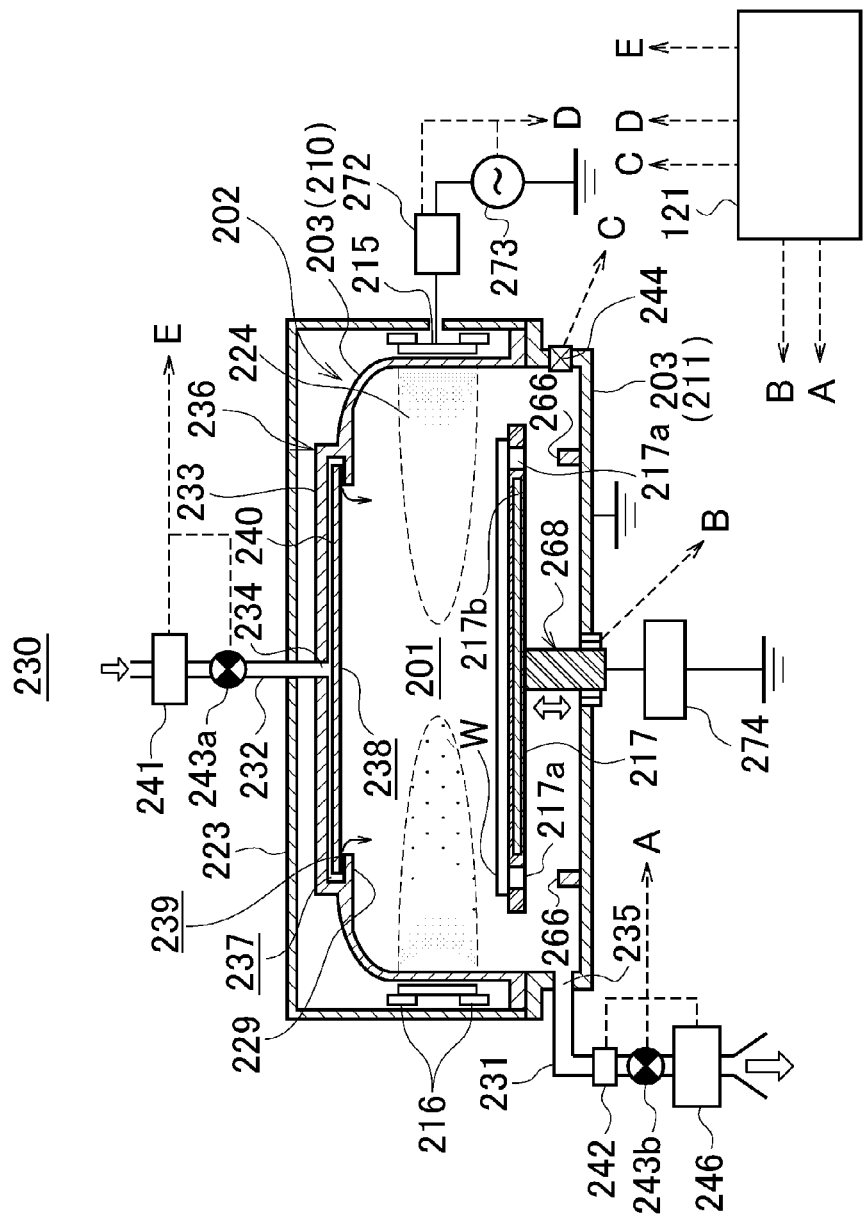
FIG. 3 is a schematic cross-sectional view illustrating a first example of a process furnace according to the first embodiment of the present invention.

Next, one example of the process furnace including the above-described process chambers (the process chambers 151 through 154) will be described with reference to FIG. 3. FIG. 3 is a cross-sectional view schematically illustrating one example of an MMT device. The MMT device refers to a substrate processing apparatus including a process furnace to plasma-process a wafer as a substrate using a modified magnetron typed plasma source which may generate high-density plasma due to an electric field and a magnetic field. In the MMT device, a substrate is installed in a process chamber whose air tightness is secured, a reactive gas is introduced into the process chamber via a shower head, the process chamber is maintained at a constant pressure, and high-frequency electric power is supplied to a discharge electrode to form an electric field and apply a magnetic field to cause magnetron discharges. As electrons emitted from the discharge electrode drift and continue to periodically rotate in a cycloid motion, a life span increases, thereby improving an ionization rate. Therefore, high-density plasma may be generated. As described above, the substrate may be processed with the plasma by various methods including a diffusion process such as oxidation or nitration of a substrate surface by excitation and decomposition of a reactive gas, a process of forming a thin film on the substrate surface and a process of etching the substrate surface.

As shown in FIG. 3, the MMT device includes a process container 203 having process chambers 201 (corresponding to the above-described process chambers 151 through 154) formed therein. The process container 203 includes a dome-type upper container 210 as a first container and a bowl-type lower container 211 as a second container. Here, the upper container 210 covers the lower container 211. The upper container 210 is formed of a non-metallic material such as aluminum oxide, aluminum nitride or quartz. The lower container 211 is formed of, for example, aluminum. Also, the lower container 211 includes a susceptor 217 that is a heater-integrated substrate holding port (a substrate holding unit) to be described later. When the susceptor 217 is formed of a non-metallic material such as aluminum nitride, ceramics or quartz, contamination of metals introduced into a film of a wafer W serving as a substrate may be reduced during the process.

A shower head 236 is installed on the upper container 210. A gas introduction port 234 through which a gas is introduced is installed on the shower head 236, and a gas outlet port 239 configured to discharge a gas in the process chamber 201 is installed under the shower head 236. A gas supply pipe 232 configured to supply a gas is connected to the gas introduction port 234. The gas supply pipe 232 is connected to a gas cylinder (not shown) which is a supply source of a reactive gas 230 via a valve 243a which is an opening/closing valve and an MFC 241 which is a flow rate controller (a flow rate control unit).

The shower head 236 generally includes a buffer chamber 237, an opening 238, a gas outlet port 239 and a shielding plate 240. The buffer chamber 237 is installed above the process chamber 201 as a gas distribution space into which a gas is introduced. The buffer chamber 237 includes a cap-shaped cover 233 configured to clog an upper portion of the opening 238, the shielding plate 240 configured to cover an upper side of the opening 238 spaced apart from the cover 233, and an opening peripheral portion 229 formed inside a lower peripheral portion of the opening 238 of the process chamber 201. Since the shielding plate 240 is installed in the buffer chamber 237, the gas distribution space is substantially a space formed between the cover 233 and the shielding plate 240. The cover 233 is made of aluminum, which is different from the upper container 210 made of a dielectric, and has a ground potential for plasma stabilization. The opening 238 is installed at a ceiling of the process chamber 201 facing a main surface of the wafer W, and configured to communicate the buffer chamber 237 and the process chamber 201 with each other. An opening diameter is substantially the same as that of the wafer W, or smaller than that of the wafer W.

The shielding plate 240 is configured to cover the opening 238 from an inner side of the buffer chamber 237, and flow a gas introduced into the buffer chamber 237 toward the opening peripheral portion 229. The shielding plate 240 is made of a dielectric such as quartz or silicon carbide. The gas outlet port 239 is installed at a gap formed between a circumferential portion of a lower surface of the shielding plate 240 and a peripheral portion of the opening 238. The gas outlet port 239 is arranged at an inner side of the buffer chamber 237, which is recessed from an opening surface of the opening 238, so that the gas outlet port 239 is not exposed to the process chamber 201 exposed to plasma. The plurality of gas outlet ports 239 are formed at a constant interval along a main direction of the opening 238, and thus configured to discharge a gas, which flows in the opening peripheral portion 229, into the process chamber 201 in a shower shape by means of the shielding plate 240.

A gas exhaust port 235 serving as an exhaust port configured to exhaust a gas is installed at a sidewall of the lower container 211 so that the reactive gas 230 is supplied from the above-described gas outlet port 239 into the process chamber 201, and the gas flows from surroundings of the susceptor 217 along a bottom direction of the process chamber 201 after processing of the substrate. The gas exhaust port 235 is connected to a vacuum pump 246 serving as an exhaust device through a gas exhaust pipe 231 serving as an exhaust pipe configured to exhaust a gas via an APC 242 serving as a pressure regulator and a valve 243b serving as an opening/closing valve.

Generally, a gas supply system includes the MFC 241, the valve 243a, the gas supply pipe 232, the gas introduction port 234 and the shower head 236. Also, a gas exhaust system generally includes the gas exhaust port 235, the gas exhaust pipe 231, the APC 242, the valve 243b and the vacuum pump 246.

A plasma generation unit configured to form a plasma generation region 224 in the process chamber 201 includes an electric discharge mechanism configured to excite the supplied reactive gas 230 and a magnetic field formation mechanism configured to trap electrons.

A cylindrical electrode 215, for example, formed in a cylindrical shape is installed as a discharge electrode at the electric discharge mechanism configured to excite the supplied reactive gas 230. The cylindrical electrode 215 is installed at a periphery of the process container 203 (the upper container 210), so that the cylindrical electrode 215 can surround the plasma generation region 224 generated in the process chamber 201. A high-frequency electric power source 273 configured to apply high-frequency electric power is connected to the cylindrical electrode 215 via a matching machine 272 configured to perform impedance matching. A high-frequency electric power supply source configured to apply high-frequency electric power to the cylindrical electrode 215 includes the above-described matching machine 272 and the high-frequency electric power source 273. As described above, the electric discharge mechanism generally includes the cylindrical electrode 215, the matching machine 272, and the high-frequency electric power source 273.

In addition, the magnetic field formation mechanism generally includes a cylindrical magnet 216. For example, the cylindrical magnet 216 serving as a magnetic field formation mechanism (a magnetic field-forming unit) formed in a cylindrical shape is formed of a permanent magnet such as a neodymium-based rare-earth cobalt magnet. The cylindrical magnet 216 is arranged in two stages around upper and lower ends of an external surface of the cylindrical electrode 215. The upper and lower cylindrical magnets 216 have magnetic poles formed at both ends (an inner circumferential end and an outer circumferential end) of the process chamber 201 along a radial direction thereof, and the magnetic poles of the upper and lower cylindrical magnets 216 are set up in an opposite direction with respect to each other. Therefore, the magnetic poles at an inner circumferential portion are different from each other, and thus a magnetic force line is formed in a cylindrical axis direction along an inner circumferential surface of the cylindrical electrode 215.

The susceptor 217 serving as a substrate holding port (a substrate holding unit) configured to hold the wafer W as a substrate is arranged at a lower central portion of the process chamber 201. The susceptor 217 has a heater 217b serving as a heating mechanism (a heating unit) integrally buried therein, and thus may be configured to heat the wafer W. The heater 217b may, for example, heat the wafer W to a temperature of approximately 700° C. to 800° C. when electric power is applied to the heater 217b.

In addition, an electrode-built-in susceptor (not shown) which is an electrode configured to change impedance is mounted in the susceptor 217. The electrode-built-in susceptor is grounded via an impedance variable mechanism 274. The impedance variable mechanism 274 includes a coil or a variable condenser, and may control a potential of the wafer W via the electrode-built-in susceptor and the susceptor 217 by controlling a pattern number of the coil or a capacity value of the variable condenser. The impedance variable mechanism 274 and the electrode-built-in susceptor mounted in the above-described susceptor 217 are also included in the above-described electric discharge mechanism.

As described above, the process furnace 202 configured to process the wafer W through a magnetron discharge in a magnetron-typed plasma source includes at least the process chamber 201, the process container 203, the susceptor 217, the cylindrical electrode 215, the cylindrical magnet 216, the shower head 236 and the gas exhaust port 235, and thus can plasma-process the wafer W in the process chamber 201.

A shielding box 223 configured to effectively shield an electric field or a magnetic field is installed around the cylindrical electrode 215 and the cylindrical magnet 216 so that the electric field or the magnetic field formed in the cylindrical electrode 215 and the cylindrical magnet 216 cannot have a negative effect on an external environment or other devices such as a process furnace.

A susceptor elevating mechanism 268 (an elevating unit) insulated from the grounded lower container 211 and configured to elevate the susceptor 217 is installed at the susceptor 217. Also, a through hole 217a is installed at the susceptor 217, and at least three wafer elevating pins 266 configured to push up the wafer W are installed at a bottom surface of the lower container 211. Then, when the susceptor 217 is lowered by the susceptor elevating mechanism 268, the through hole 217a and the wafer elevating pin 266 are arranged in such a positional relationship that the wafer elevating pin 266 passes through the through hole 217a in a state in which the wafer elevating pin 266 does not come in contact with the susceptor 217.

Also, a gate valve 244 serving as an opening/closing valve is installed at a sidewall of the lower container 211. Therefore, when the gate valve 244 is open, the wafer W may be loaded or unloaded with respect to the process chamber 201 by means of a transfer mechanism (a transfer unit, not shown), and an inner part of the process chamber 201 may be hermetically closed when the gate valve 244 is closed.

Also, a controller 121 serving as a control unit is configured to control the APC 242, the valve 243b and the vacuum pump 246 through a signal line A, control the susceptor elevating mechanism 268 through a signal line B, control the gate valve 244 through a signal line C, control the matching machine 272 and the high-frequency electric power source 273 through a signal line D, control the MFC 241 and the valve 243a through a signal line E, and control the heater 217b and the impedance variable mechanism 274, both of which are buried in the susceptor 217, through a signal line (not shown).

(2) Substrate Processing Steps

Hereinafter, the substrate processing steps using the substrate processing apparatus 101 having the above-described configuration will be described with reference to FIGS. 1 through 3. In the substrate processing steps, an operation of each part of the substrate processing apparatus 101 is controlled by the control unit 108.

For example, 25 unprocessed wafers W are transferred to a substrate processing apparatus configured to perform the substrate processing steps using an in-process transfer device (not shown) in a state in which the unprocessed wafers W are accommodated in the pods PD1 through PD4. The transferred pods PD1 through PD4 are received from the in-process transfer device, and placed on the load ports LP1 through LP4. The caps of the pods PD1 through PD4 and the lid 105 configured to close the wafer transfer port 104 are separated by the opening/closing mechanism 102, and wafer entrance ports (not shown) of the pods PD1 through PD4 are opened.

When the wafer entrance ports (not shown) of the pods PD1 through PD4 are opened, the atmosphere transfer robot 122 installed at the atmosphere transfer chamber 120 picks up one wafer W from the pods PD1 through PD4.

Then, the wafer is conveyed to the notch adjusting device 107, and a position of the wafer (a first wafer W) is adjusted. The notch adjusting device 107 is configured to adjust the position of the wafer W in an X-axis direction, a Y-axis direction and a circumferential direction. The next wafer (a second wafer W) is conveyed into the atmosphere transfer chamber 120 by performing notch adjustment and simultaneously performing a pickup operation using the atmosphere transfer robot 122.

When the positional adjustment of the first wafer W by the notch adjusting device 107 is completed, the atmosphere transfer robot 122 conveys the first wafer W on the notch adjusting device 107 into the atmosphere transfer chamber 120. In this case, the second wafer held by the atmosphere transfer robot 122 is conveyed into the notch adjusting device 107. Then, notch adjustment is performed for the second wafer W.

Subsequently, the gate valve 167 is opened, and the first wafer W is loaded into the load lock chamber 131 and placed on the substrate support 133. During the conveyance process, since the gate valve 165 arranged at the vacuum transfer chamber 110 is closed, a reduced pressure atmosphere in the vacuum transfer chamber 110 is maintained.

When the conveyance of the first wafer W into the substrate support 133 is completed, the gate valve 167 is closed, and the load lock chamber 131 is exhausted to reduced pressure (for example, vacuum) by an exhaust device (not shown). In addition to the exhaust process, the atmosphere transfer robot 122 picks up the second wafer W from the notch adjusting device 107, opens the gate valve 168 to load the second wafer W into the load lock chamber 141 and conveys the second wafer W into the substrate support 143. During the conveyance process, the gate valve 166 arranged at the vacuum transfer chamber 110 is closed, and a reduced pressure atmosphere in the vacuum transfer chamber 110 is maintained. In this case, the gate valve 168 is closed, and an inner atmosphere of the load lock chamber 141 is exhausted to a reduced pressure atmosphere by means of an exhaust device (not shown).

Thereafter, the atmosphere transfer robot 122 repeatedly performs the above-described operations. However, when the load lock chamber 131 and the load lock chamber 141 are in a reduced pressure atmosphere, loading of the wafer W into the load lock chamber 131 and the load lock chamber 141 is not performed, and the transfer of the wafer W is stopped in a position directly in front of the load lock chamber 131 and the load lock chamber 141.

When a pressure in the load lock chamber 131 is reduced to a predetermined pressure value, the gate valve 165 is opened.

Subsequently, the vacuum transfer robot 112 of the vacuum transfer chamber 110 picks up the first wafer W from the substrate support 133.

After the pickup step, the gate valve 165 is closed so that the load lock chamber 131 can return to an atmospheric pressure, and the next wafer (a third wafer W) is ready to be loaded. In addition to such a process, the gate valve 161 of the process chamber 151 is opened, and the vacuum transfer robot 112 loads the first wafer W into the process chamber 151. Then, a process gas is supplied from a gas supply device (not shown) into the process chamber 151, and a desired process is performed on the first wafer W.

Subsequently, when a pressure in the load lock chamber 141 is reduced to a predetermined pressure value, the gate valve 162 is opened. Subsequently, the vacuum transfer robot 112 of the vacuum transfer chamber 110 picks up the second wafer W from the substrate support 143. After the pickup step, the gate valve 166 is closed so that the load lock chamber 141 can return to atmospheric pressure, and the next wafer (a fourth wafer W) is ready to be loaded. At the same time, the gate valve 162 of the process chamber 152 is opened, and the vacuum transfer robot 112 loads the second wafer into the process chamber 152. Then, a process gas is supplied from a gas supply device (not shown) into the process chamber 152, and a desired process is performed on the second wafer W.

Thereafter, another wafer W is loaded into the process chamber 153 and the process chamber 154 and subjected to a desired process in the same manner. For example, the following plasma process is performed.

As previously shown in FIG. 3, the wafer W is loaded into the process chamber 201 by a transfer unit (not shown, corresponding to the vacuum transfer robot 112 in FIG. 1) configured to transfer the wafer W from an outside of the process chamber 201, and placed on the susceptor 217. The details of the transfer step are as follows. First, in a state in which the susceptor 217 is lowered and a front end of the wafer elevating pin 266 passes through the through hole 217a of the susceptor 217 and protrudes by a predetermined height from a surface of the susceptor 217, the gate valve 244 (corresponding to the gate valves 161 through 164 shown in FIG. 1) installed at the lower container 211 is opened. In turn, the wafer W is placed on a front end of the wafer elevating pin 266 by the transfer unit. Then, the transfer unit (corresponding to the transfer arm 113 or the second transfer arm 114 of the vacuum transfer robot 112 shown in FIG. 1) is retracted toward an outer side of the process chamber 201. Subsequently, when the gate valve 244 is closed and the susceptor 217 is elevated by the susceptor elevating mechanism 268, the wafer W is placed on an upper surface of the susceptor 217. The susceptor 217 is elevated to a position in which the wafer W is processed.

Since the heater 217b buried in the susceptor 217 is previously heated by the controller 121, the loaded wafer W is heated to a wafer processing temperature ranging from room temperature to 600° C. A pressure of the process chamber 201 is maintained within a range of 1 Pa to 260 Pa using the vacuum pump 246 and the APC 242.

For example, after the wafer W is heated to a predetermined processing temperature, a reactive gas is introduced in a shower shape toward an upper surface (processing surface) of the wafer W in the process chamber 201 via the gas outlet port 239 of the shower head 236 from the gas introduction port 234, and simultaneously exhausted from the gas exhaust port 235. In addition to such a process, high-frequency electric power is applied from the high-frequency electric power source 273 to the cylindrical electrode 215 via the matching machine 272. A reactive gas is, for example, a nitrogen gas, an oxygen gas, a mixture gas of oxygen and hydrogen, or a mixture gas thereof.

A magnetron discharge is generated by an effect of magnetic fields of the cylindrical magnets 216, charges are captured in an upper space of the wafer W, and high-density plasma is generated at the plasma generation region 224. Then, a surface of the wafer W on the susceptor 217 is plasma-processed by the generated high-density plasma.

As previously shown in FIG. 1, after the desired process in the process chamber 151 is completed, the vacuum transfer robot 112 loads the wafer (a first wafer W) unloaded from the process chamber 151 into the load lock chamber 131, and, for example, places the wafer on a lower end of the substrate support 133. In this case, when an unprocessed wafer W is present in the load lock chamber 131, the vacuum transfer robot 112 conveys the unprocessed wafer W from the load lock chamber 131 into the vacuum transfer chamber 110. Also, when the desired process in the process chamber 152 is completed, the vacuum transfer robot 112 loads the wafer (a second wafer W) unloaded from the process chamber 152 into the load lock chamber 131, and for example, places the wafer on an upper end of the substrate support 133.

In this case, the gate valve 165 is closed, an inert gas is introduced from an inert gas supply device (not shown) connected to the load lock chamber 131 while cooling the processed wafers (the first and second wafers W), and a pressure in the load lock chamber 131 returns to an atmospheric pressure. Here, a nitrogen gas is used as the inert gas, but clean air other than a rare gas such as helium (He) or argon (Ar) may also be used.

When a predetermined cooling time passes in the load lock chamber 131 and the pressure in the load lock chamber 131 returns to an atmospheric pressure, the gate valve 167 is opened. Subsequently, the atmosphere transfer robot 122 picks up the processed wafers (the first and second wafers W) from the substrate supports 133 through 136 and conveys the processed wafers into the atmosphere transfer chamber 120. In turn, the gate valve 167 is closed. Then, the unloaded wafer W is accommodated into a predetermined pod of the pods PD1 through PD4 through the wafer transfer port 104 of the atmosphere transfer chamber 120.

When all the wafers W in the pods PD1 through PD4 are desirably processed by the above-described process and each of the 25 processed wafers W of the pods PD1 through PD4 is accommodated, the pods PD1 through PD4 are closed with the caps by the opening/closing mechanism 102, and the wafer transfer port 104 is also closed with the lid 105. The closed pods PD1 through PD4 are transferred from the load ports LP1 through LP4 using the in-process transfer device to perform the next process. 25 wafers W are sequentially processed by performing the above-described processes repeatedly.

(First Embodiment of Load Lock Chamber)

When the wafer W processed in the process chambers 151 through 154 (the process chamber 201) is loaded into the load lock chamber 131 and the load lock chamber 141, the wafer W is at a high temperature. In turn, a plurality of wafers W may be loaded into the load lock chamber 131 and the load lock chamber 141. In this case, in the load lock chamber (see FIGS. 4A and 4B) of Comparative Example, the plurality of wafers W are affected by heat of the wafer W loaded into the load lock chamber. For example, the plurality of wafers W are affected by radiant heat from the high temperature wafer W in a reduced pressure atmosphere, and affected by heat caused by thermal conduction via an atmosphere from the high temperature wafer W when a pressure in the load lock chamber 131 and the load lock chamber 141 reaches an atmospheric pressure atmosphere.

Accordingly, in order to solve the above-described problems, the load lock chamber 131 and the load lock chamber 141 are configured in this embodiment as follows.

Figure 5:
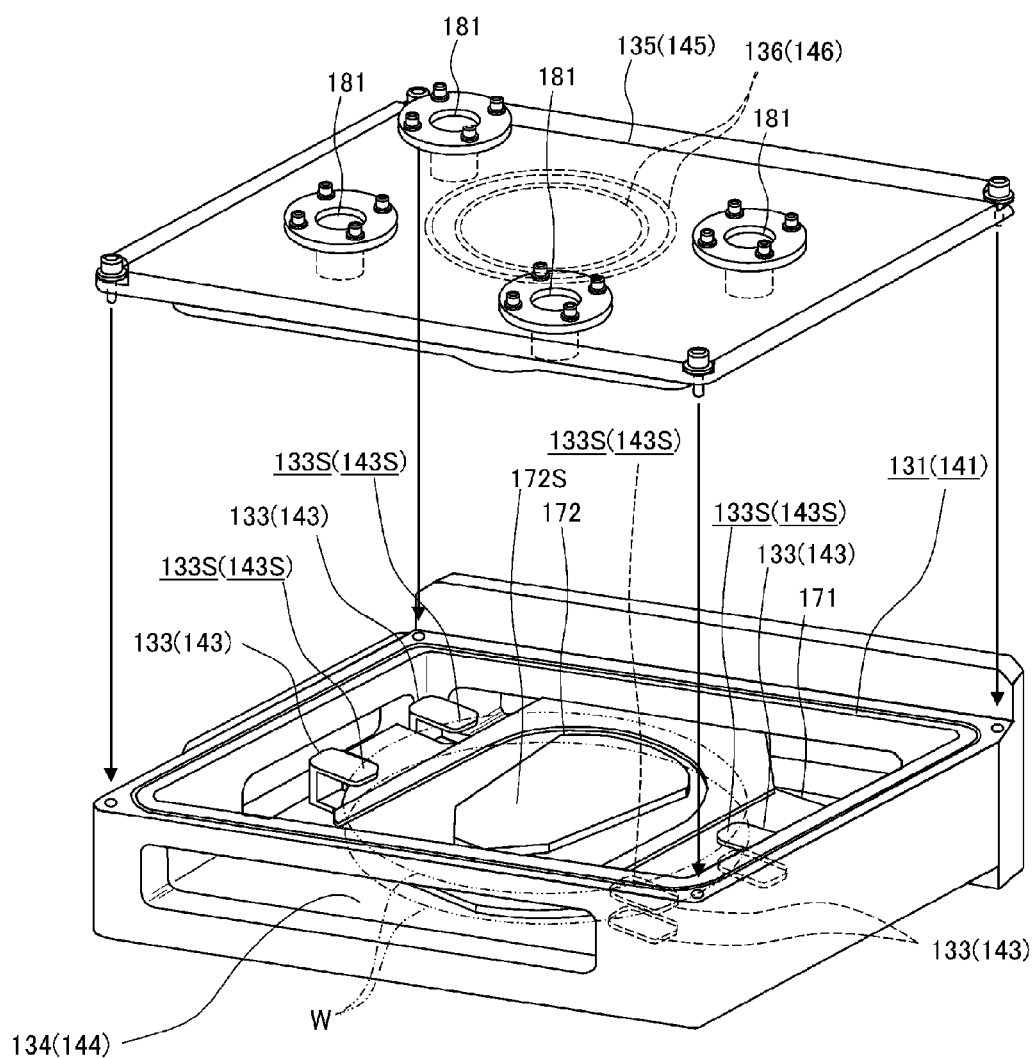
FIG. 5 is a schematic perspective view of a load lock chamber according to the first embodiment of the present invention.
Figure 6:
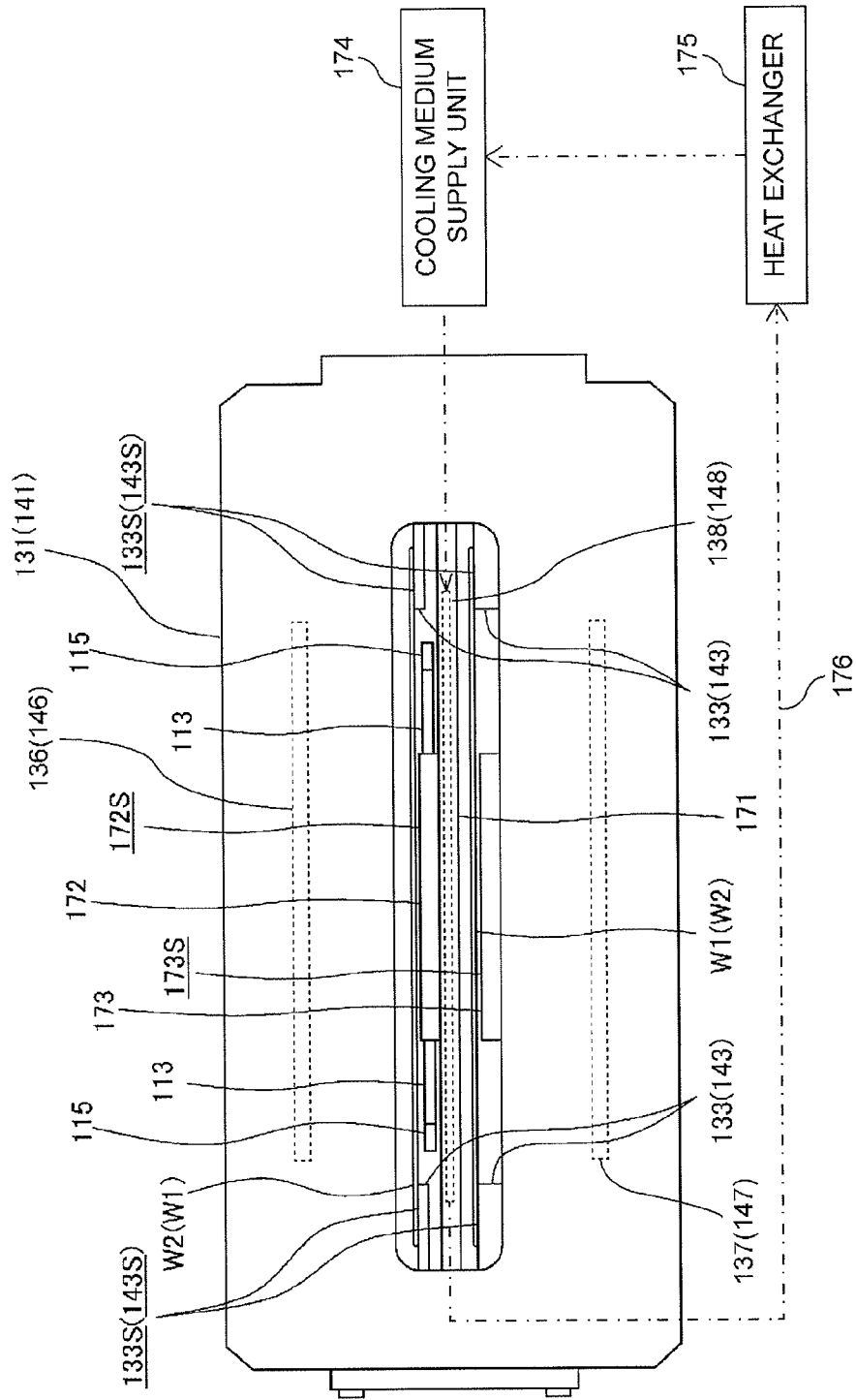
FIG. 6 is a schematic front view of the load lock chamber according to the first embodiment of the present invention.
Figure 7:
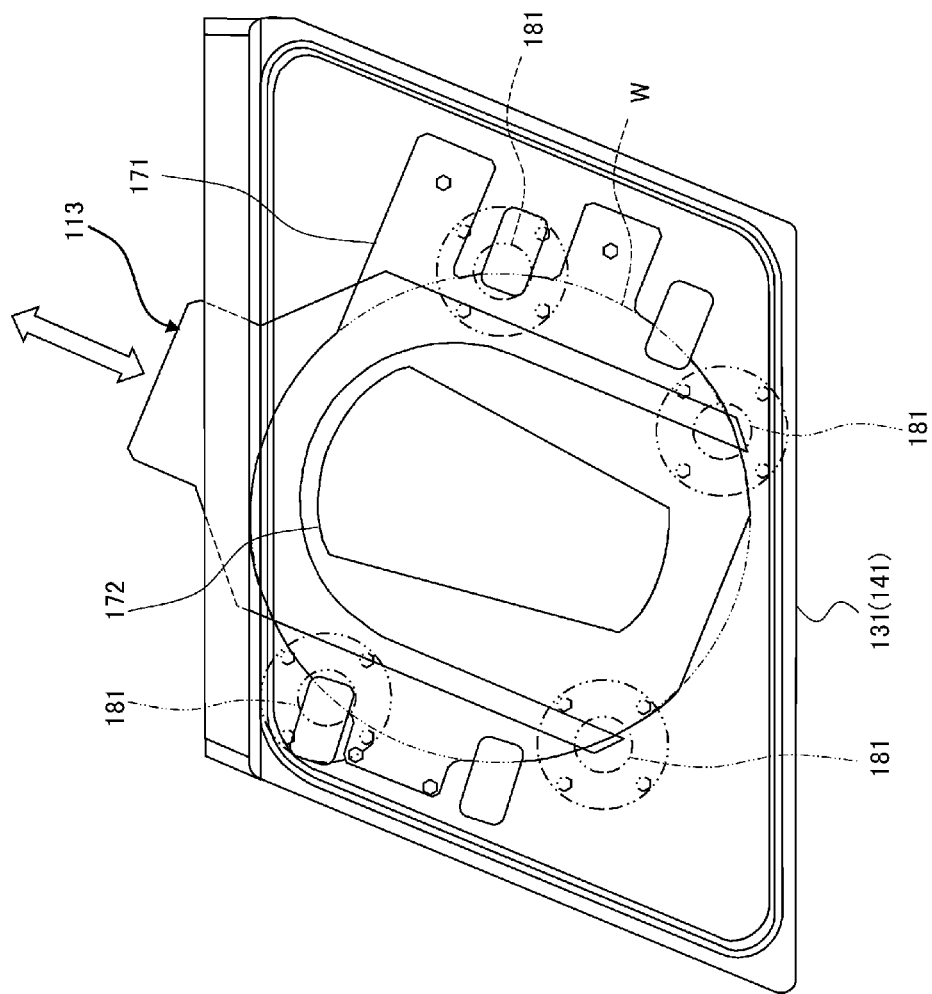
FIG. 7 is a schematic top view of the load lock chamber according to the first embodiment of the present invention.

The details of the load lock chamber 131 and the load lock chamber 141 will be described with reference to a schematic perspective view of FIG. 5, a schematic front view of FIG. 6 and a schematic top view of FIG. 7. In FIGS. 5 through 7, the load lock chamber 131 will be described as a representative of the load lock chamber 131 and the load lock chamber 141. Also, the load lock chamber 131 and the load lock chamber 141 have the same configuration, and the load lock chamber 141 is represented in parentheses with a reference numeral.

(Entire Configuration)

As shown in FIGS. 5 through 7, a barrier 171 configured to interrupt heat transfer between wafers W, an auxiliary barrier unit 172 configured to absorb radiant heat of the wafers W, and a substrate support 133 configured to support the plurality of wafers W in multiple stages are generally installed in the load lock chamber 131 (141). Also, an end effector standby space is set between the barrier 171 and the substrate support 133 when seen in a vertical direction, and set in a more central position than the substrate support 133 when seen in a horizontal direction. The end effector standby space is a space in which an end effector waits when a substrate is supported by the substrate support 133. Also, a window 181 is installed at a ceiling wall 135 (145) of the load lock chamber 131 (141).

(Barrier)

The barrier 171 is installed between the wafers W (a wafer W1 and a wafer W2) accommodated in the load lock chamber 131 (141) to be spaced apart from the wafers W.

When the barrier 171 is formed in a smaller size than an external shape of the wafer W, a region of the wafer W corresponding to a region in which the barrier is not formed is affected by heat from other wafers W, thereby reducing a cooling effect. Therefore, the barrier 171 is formed to a greater size than the external shape of the wafer W to enhance a cooling effect of the wafer W. Also, a part of an external shape of the barrier 171 is preferably formed in the same shape as a part of the external shape of the wafer W. A region of the external shape of the barrier 171 having the same shape as the external shape of the wafer W is preferably arranged in a symmetric position (point symmetry or line symmetry) with respect to the center of the wafers W placed respectively in the load lock chamber 131 (141).

A channel 138 (148) through which a cooling medium flows is formed in the barrier 171. The cooling medium may include water, a liquid such as liquefied gas, or a gas such as cooled nitrogen gas or a rare gas. Therefore, a cooling medium supply unit 174 configured to supply the cooling medium is connected to an upstream side of the channel of the barrier 171, and an exhaust pipe 176 configured to exhaust the cooling medium is connected to a downstream side of the channel. A heat exchanger 175 is connected to the exhaust pipe, the cooling medium warmed in the barrier 171 is re-cooled by the heat exchanger, and the cooled cooling medium is transferred to the cooling medium supply unit. The cooling medium may be re-used through the above-described circulation of the cooling medium.

A surface of the barrier 171 is preferably subjected to blackened surface so as to enhance absorption of heat such as radiant heat. For example, when the barrier 171 is formed of stainless steel, the stainless steel is subjected to blackened surface. Here, the blackened surface may include an emulsion oxidation method, an acid oxidation method, an alkali oxidation method, etc.

(Auxiliary Barrier Unit)

The auxiliary barrier unit 172 is installed in a region other than a movement region of each of the first transfer arm 113 including the first end effector 115 and the third transfer arm 123 including the third end effector 125 (not shown), that is, a region other than the end effector standby space on the barrier. In particular, the auxiliary barrier unit 172 is installed to be close to the wafer W2 accommodated in an upper portion of the barrier 171. For example, the auxiliary barrier unit 172 is installed between fingers of the end effector 115. The auxiliary barrier unit 172 may be configured to be installed on the barrier 171 separately from the barrier 171, and may be configured to be installed integrally with the barrier 171. Also, the barrier 171 may be configured to be installed around the auxiliary barrier unit 172.

A distance between the auxiliary barrier unit 172 and the wafer W2 accommodated directly on the auxiliary barrier unit 172 is set to range from 0.5 mm to 2 mm. Since the distance between the auxiliary barrier unit 172 and the wafer W2 accommodated directly on the auxiliary barrier unit 172 is 0.5 mm or more, the wafer W2 does not come in contact with the auxiliary barrier unit 172 even when the wafer W2 is bent. Also, since the distance is 2 mm or less, the auxiliary barrier unit 172 may effectively absorb radiant heat of the wafer W2. Also, when the distance is shorter than 0.5 mm, the wafer W2 comes in contact with the auxiliary barrier unit 172 as the wafer W2 is bent, and thus the wafer W2 is rapidly cooled, thereby accelerating bending of the wafer W2. Also, as a rear surface of the wafer W2 comes in contact with the auxiliary barrier unit 172, the rear surface of the wafer W2 may be damaged. Also, when the distance exceeds 2 mm, the auxiliary barrier unit 172 is extremely remote from the wafer W2. Therefore, absorption of radiant heat may be difficult.

Also, a channel through which a cooling medium flows is preferably installed in the auxiliary barrier unit 172. A channel formed in the auxiliary barrier unit 172 and a channel formed in the barrier 171 may be connected to each other, or may not be connected to each other. In the channel installed in the auxiliary barrier unit 172, a cooling medium may also be circulated in the same manner as the channel formed in the barrier 171.

A surface of the auxiliary barrier unit 172 is preferably subjected to blackened surface so as to enhance absorption of heat such as radiant heat. For example, when the auxiliary barrier unit 172 is made of stainless steel, the blackened surface may include an emulsion oxidation method, an acid oxidation method, an alkali oxidation method, etc.

(Substrate Support)

The substrate support 133 (143) is configured in a plural number (4 in the drawings), and installed to be fixed to a bottom wall 134 (144) in the load lock chamber 131 (141). Each of upper supporting surfaces 133S (143S) configured to support the wafer W on the substrate support 133 (143) is arranged in a higher position than an upper surface 172S of the auxiliary barrier unit 172.

(Auxiliary Bottom Wall Unit)

In addition, a auxiliary bottom wall unit 173 identical to the auxiliary barrier unit 172 is preferably installed at the bottom wall 134 (144) of the load lock chamber 131 (141). In this case, a distance between the auxiliary bottom wall unit 173 and the wafer W1 accommodated directly on the auxiliary barrier unit 172 is set to range from 0.5 mm to 2 mm. Since the distance between the auxiliary bottom wall unit 173 and the wafer W1 accommodated directly on the auxiliary barrier unit 172 is 0.5 mm or more, the wafer W1 does not come in contact with the auxiliary bottom wall unit 173 even when the wafer W1 is bent. Also, since the distance is 2 mm or less, radiant heat of the wafer W1 is effectively absorbed by the auxiliary bottom wall unit 173. Also, when the distance is shorter than 0.5 mm, a rear surface of the wafer W1 comes in contact with the auxiliary bottom wall unit 173 and is rapidly cooled as the wafer W1 is bent, thereby accelerating bending of the wafer W2. Also, the rear surface of the wafer W1 may be damaged when the rear surface of the wafer W1 comes in contact with the auxiliary bottom wall unit 173. Also, when the distance exceeds 2 mm, the auxiliary bottom wall unit 173 is extremely remote from the wafer W1. Therefore, absorption of radiant heat may be difficult.

A channel through which a cooling medium flows is preferably installed in the auxiliary bottom wall unit 173. In each of the channels installed in the auxiliary bottom wall unit 173 and the bottom wall 134 (144), a cooling medium may also be circulated in the same manner as the channel formed in the barrier 171.

A surface of the auxiliary bottom wall unit 173 is preferably subjected to blackened surface so as to enhance absorption of heat such as radiant heat. For example, when the auxiliary bottom wall unit 173 is made of stainless steel, the blackened surface may include an emulsion oxidation method, an acid oxidation method, an alkali oxidation method, etc.

(Cooling Structure in Walls of Load Lock Chamber)

In addition, a channel 137 (147) through which a cooling medium flows is preferably formed in the bottom wall 134 (144) of the load lock chamber 131 (141). The channel formed in the bottom wall 134 (144) may be connected to the channel formed in the above-described auxiliary bottom wall unit 173, or may not be connected to the channel formed in the auxiliary bottom wall unit 173. Also, a channel 136 (146) through which a cooling medium flows may be formed in each ceiling wall 135 (145) of the load lock chamber 131 (141). A channel is preferably installed in an opposite position of the wafer W placed on the substrate support 133 (143).

(Window)

Next, the window 181 will be described with reference to FIGS. 5 and 7. Also in FIG. 7, the ceiling wall 135 (145) is not shown, and the window 181 installed at the ceiling wall 135 (145) is shown by a two-dot chain line.

The window 181 is installed in a position in which partial overlapping of the external shape of the barrier 171 and the external shape of the wafer W is viewed at a wall (the ceiling wall 135 (145) or the bottom wall 134 (144)) of the load lock chamber 131 (141) which is opposite to a front surface or a rear surface of the wafer W. More preferably, the window 181 is arranged in a position opposite to a region of the external shape of the barrier 171 having the same shape as the external shape of the wafer W. The window 181 may be made of a transparent material that does not damage air tightness in the load lock chamber 131 141 such as quartz, aluminum oxide or heat-resistant glass.

(Cooling Action of Wafer in Load Lock Chamber)

Next, a procedure of returning the load lock chamber 131 to atmospheric pressure after the processed wafer W is loaded into the load lock chamber 131 to perform a cooling action will be described in detail. Two processed wafers W (a first wafer and a second wafer) are placed on a lower end and an upper end of the substrate support 133 in the load lock chamber 131. For example, the first wafer W is first loaded and placed on a lower end of the substrate support 133. Then, the second wafer W having a higher temperature than the first wafer W is loaded and placed on an upper end of the substrate support 133. When the wafer W is placed on the substrate support 133, it is possible to visually confirm whether the wafer W is placed in a predetermined position from the window 181. Also, when the wafer W is placed askew, performing the transfer of the wafer W again is preferred. Since radiant heat from the second wafer W is interrupted by the barrier 171 and absorbed by the auxiliary barrier unit 172 in a reduced pressure atmosphere, the first wafer W is cooled without reducing a cooling rate. Also, the second wafer W emitting radiant heat is cooled by an endothermic reaction of the auxiliary barrier unit 172. When an inside of the load lock chamber 131 reaches an atmospheric pressure atmosphere, the first and second wafers W are cooled by thermal conduction via an atmosphere from the barrier 171 and the auxiliary barrier unit 172 which are all cooled by the cooling medium.

Meanwhile, when at least one of the process chambers 151 through 154 (for example, the process chamber 152) performs a different processing steps, a temperature of the second wafer W which is processed in the process chamber 152 and then loaded into the load lock chamber 131 may be lower than that of the previously loaded first wafer W. In this case, since radiant heat from the first wafer W is interrupted by the barrier 171 and absorbed by the auxiliary bottom wall unit 173 installed at a lower portion of the barrier 171 in the reduced pressure atmosphere, the second wafer W is cooled with no effect on the radiant heat of the first wafer W. At the same time, the first wafer W emitting the radiant heat is also cooled. Then, when an inside of the load lock chamber 131 reaches an atmospheric pressure atmosphere, the first and second wafers W are cooled by thermal conduction via an atmosphere from the barrier 171, the auxiliary barrier unit 172 and the auxiliary bottom wall unit 173 which are all cooled by the cooling medium.

(3) Effects According to this Embodiment

According to this embodiment, the substrate processing apparatus 101 has one or more effects, as follows.

(a) In the substrate processing apparatus 101 according to this embodiment, although the second wafer W having a higher temperature than the processed first wafer W is loaded into the load lock chamber 131 while the previously loaded first wafer W is cooled in the load lock chamber 131, heat from the second wafer W is interrupted by the barrier 171. Therefore, reducing a cooling effect of the first wafer W may be suppressed. In particular, when the wafer W arranged at the atmosphere transfer chamber 120 is unloaded, an inside of the load lock chamber 131 returns to an atmospheric pressure. For example, the inside of the load lock chamber 131 returns to an atmospheric pressure by introducing nitrogen or clean air into the load lock chamber 131. In the load lock chamber 131 in an atmospheric pressure state, heat transfer between the wafers W is predominantly thermally conduced via an atmosphere gas. Therefore, since thermal conduction between the wafers W is interrupted when the barrier 171 is installed between the wafers W, the wafer W having a low temperature is not affected by heat of the wafer W having a high temperature. Therefore, reduction of a cooling rate of the wafer W having a low temperature may be suppressed.

(b) When the barrier 171 is merely installed in the load lock chamber 131, a distance between the barrier 171 and the wafer W is lengthened by thicknesses of the first end effector 115 and the second end effector 116 in the ends of the first transfer arm 113 and the second transfer arm 114 and thicknesses of the third end effector 125 and the fourth end effector 126 in the ends of the third transfer arm 123 and the fourth transfer arm 124. Therefore, a cooling effect of the wafer W by the barrier 171 may not be sufficiently secured. In particular, since heat transfer caused by radiation is the main under a reduced pressure, the wafer W is preferably arranged as close as possible to the barrier 171 so that the radiant heat can be absorbed by the barrier 171. The substrate processing apparatus according to this embodiment includes the auxiliary barrier unit 172 configured to reach the wafer W accommodated on the barrier 171 and absorb radiant heat of the wafer W. The radiant heat from the wafer W directly on the auxiliary barrier unit 172 may be effectively absorbed by the auxiliary barrier unit 172. Therefore, even when the second wafer W having a high temperature is placed on an upper end of the substrate support 133 during cooling of the first wafer W, reduction of a cooling rate of the first wafer W may be suppressed. In particular, when the wafer W is transferred from the vacuum transfer chamber 110 into the load lock chamber 131, an inside of the load lock chamber 131 is in a reduced pressure state (for example, a vacuum state). Therefore, radiant heat is predominately present in heat emitted from the wafer W. Therefore, a cooling effect is particularly improved by absorbing the radiant heat of the wafer W into the auxiliary barrier unit 172, as described above.

(c) Also, in the substrate processing apparatus according to this embodiment, since the barrier 171 is formed to a greater size than an external shape of the wafer W, an influence of the radiant heat from the wafer W having a high temperature may be reliably interrupted by the barrier 171. Therefore, reduction of a cooling rate of the low temperature wafer W, which is placed in the load lock chamber 131 and the load lock chamber 141, may be suppressed. Also, even a circumferential end of the wafer W loaded into the load lock chamber 131 and the load lock chamber 141 may be cooled by the barrier 171.

(d) In the substrate processing apparatus according to this embodiment, since a distance between the auxiliary barrier unit 172 and the wafer W accommodated directly on the auxiliary barrier unit 172 is in a range of 0.5 mm to 2 mm, the auxiliary barrier unit 172 may effectively absorb radiant heat of the wafer W.

Figure 8:
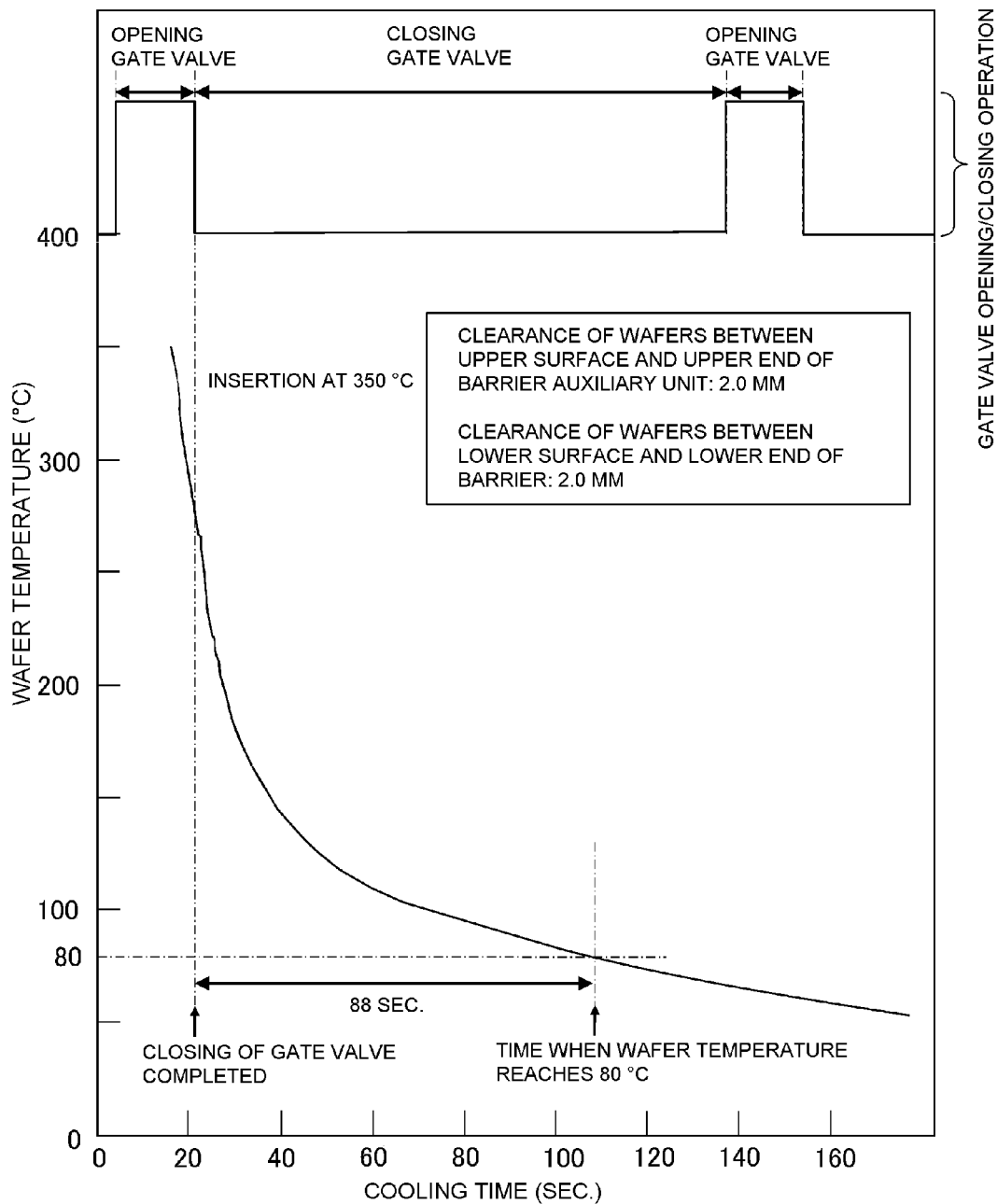
FIG. 8 is a diagram illustrating a relationship between a wafer temperature and a cooling time in the load lock chamber according to the first embodiment of the present invention.

For example, when the wafer W is transferred into the load lock chamber 131, a cooling rate of the wafer W may be increased due to an endothermic effect of the auxiliary barrier unit 172. For example, as shown in FIG. 8, the processed wafer W is transferred from the vacuum transfer chamber 110 into the load lock chamber 131, and placed on the supporting surface 133S arranged on the upper end of the substrate support 133. A temperature of the placed wafer W was 350° C. Then, the gate valve 165 is closed, and nitrogen or clean air is introduced into the load lock chamber 131 so as to return an inside of the load lock chamber 131 to an atmospheric pressure state. As a result, a temperature of the wafer W reached a desired cooling temperature of 80° C. at a time point of 88 seconds. As described above, a cooling time taken to perform a cooling process of cooling the wafer W of 350° C. to a temperature of 80° C. may be set to approximately 90 seconds. Also, a rapid cooling rate at an early cooling stage is due to a cooling action by the nitrogen or clean air introduced into the load lock chamber 131.

Figure 4A:
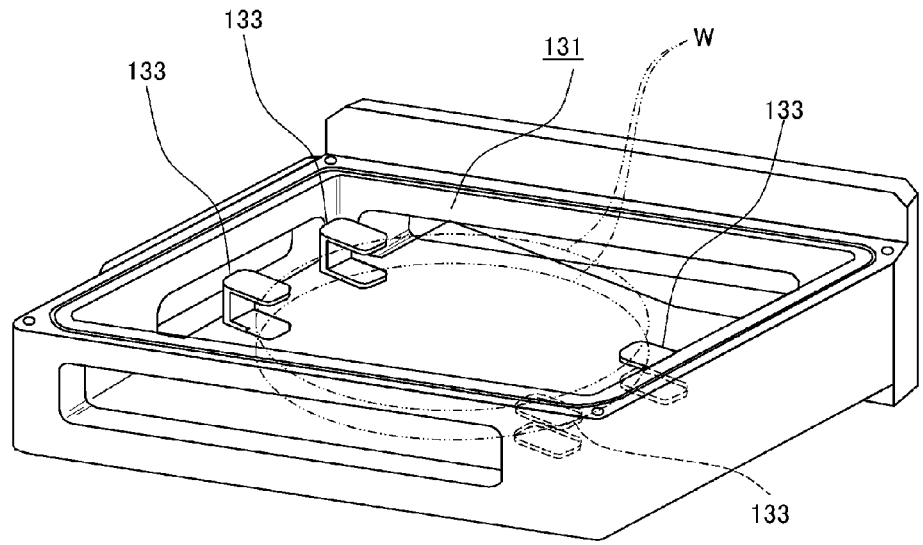
FIGS. 4A and 4B are a perspective view and a front view schematically illustrating a load lock chamber according to Comparative Example, respectively.
Figure 4B:
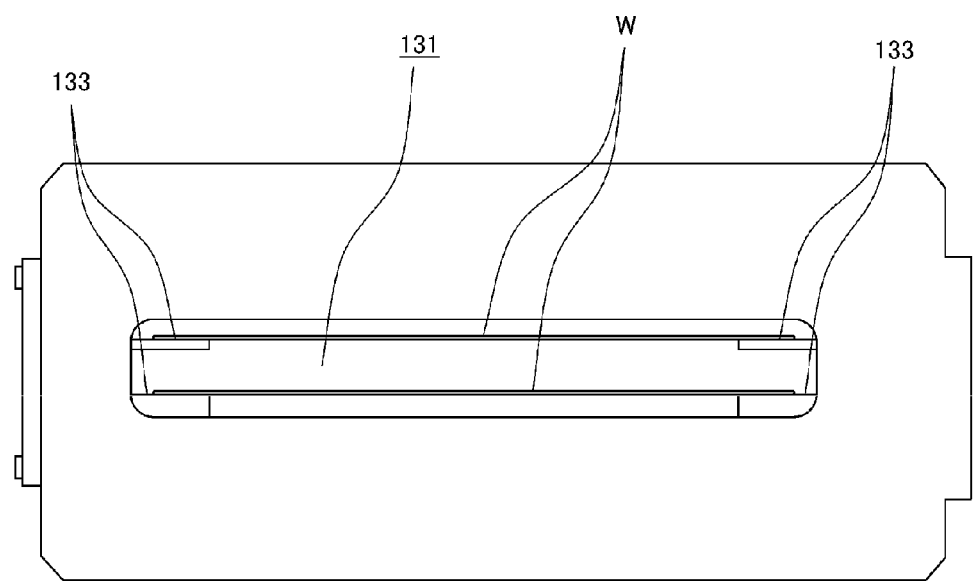

Also as previously shown in FIGS. 4A and 4B, when the wafer W is loaded into a conventional load lock chamber 131 having neither the barrier 171 nor the auxiliary barrier unit 172, placed on the substrate support 133 and cooled by introducing nitrogen or clean air to return an inside of the conventional load lock chamber 131 from a vacuum state to an atmospheric pressure state, a cooling time of 90 seconds or more was necessarily required to cool the wafer W from 350° C. to a temperature of 80° C. In a current process of manufacturing a semiconductor device, since a time taken to process the wafer W at a considerably high temperature is lengthened, a time when the wafer W stays in the load lock chamber 131 is lengthened in consideration of the cooling time. Therefore, the number of the processed wafers W is decreased as a processing time of the wafer W is lengthened. Also, FIG. 4A shows a schematic perspective view, and FIG. 4B shows a schematic front view.

Since the cooling time may be shortened in the substrate processing apparatus 101 as described above, device throughput including cooling of the wafer W may be improved with a processing rate of 100 or more wafers W per hour. Therefore, the number of the processed wafer W may be significantly increased by shortening the cooling time. In the load lock chamber 141, the above-described effects may be obtained in the same manner as in the load lock chamber 131.

(e) In the substrate processing apparatus according to this embodiment, since a channel (not shown) through which a cooling medium flows is formed in the barrier 171, the barrier 171 itself may be effectively cooled even when the barrier 171 receives radiant heat emitted from the wafer W. Also, when an inside of the load lock chamber 131 returns to an atmospheric pressure atmosphere, heat transfer is predominantly present due to the atmosphere. Therefore, a cooling rate of the wafer W may be improved by the cooled barrier 171. Also, in the configuration in which the channel through which a cooling medium flows is installed in the auxiliary barrier unit 172, the same effects as in the barrier 171 may be realized. In particular, when the auxiliary barrier unit 172 receives and absorbs radiant heat, the absorbed radiant heat is removed by the cooling medium flowing through the channel. Therefore, heating of the auxiliary barrier unit 172 is suppressed, and the radiant heat is easy to absorb.

(f) The substrate processing apparatus according to this embodiment includes the auxiliary barrier unit 172 formed at a region other than the movement regions of the first transfer arm 113 and the second transfer arm 114 (substantially the first end effector 115 and the second end effector 116) and the movement regions of the third transfer arm 123 and the fourth transfer arm 124 (substantially the third end effector 125 and the fourth end effector 126) in order to secure movement regions of the first end effector 115 and the second end effector 116 and movement regions of the third end effector 125 and the fourth end effector 126. Therefore, the transfer of the wafer is not interrupted by the auxiliary barrier unit 172.

(g) In the substrate processing apparatus according to this embodiment, since a surface of each of the barrier 171, the auxiliary barrier unit 172 and the auxiliary bottom wall unit 173 is subjected to blackened surface, absorption of radiant heat from the wafer W may be enhanced. Therefore, a cooling rate of the wafer W may be accelerated.

(h) The substrate processing apparatus according to this embodiment includes the window 181 on which partial overlapping of the external shape of the barrier 171 and the external shape of the wafer W is viewed at a wall (for example, the ceiling wall 135) of the load lock chamber 131 (141) which is opposite to a front surface or a rear surface of the wafer W. Therefore, a positional relationship of the wafer W with respect to the barrier 171 is easily confirmed on the window 181. Also, since the window 181 is arranged in a position corresponding to a region of the external shape of the barrier 171 having the same shape as the external shape of the wafer W, it is easy to view whether or not the wafer W is arranged askew with respect to the barrier 171.

(i) In the substrate processing apparatus according to this embodiment, since a region of the external shape of the barrier 171 having the same shape as the external shape of the wafer W is arranged in a symmetric position with respect to the center of the wafer W placed into the load lock chamber 131 and the load lock chamber 141, it becomes easy to find a difference in the wafer W during teaching. Meanwhile, when the region of the external shape of the barrier 171 having the same shape as the external shape of the wafer W is not arranged in a symmetric position with respect to the center of the substrate, it is difficult to determine whether or not the wafer W is arranged askew.

(j) In the substrate processing apparatus according to this embodiment, since the load lock chamber 131 and the load lock chamber 141 configured to be able to cool the wafer W are installed on a transfer path of the wafer W spanning from the process chambers 151 through 154 to the atmosphere transfer chamber 120 serving as a second transfer chamber, there is no need to separately install a cooling chamber configured to cool the processed wafer W. Therefore, shortening of a transfer time and reduction in cost of equipment are possible.

(k) In the substrate processing apparatus according to this embodiment, the substrate supports 133 and 143 are fixed to the bottom wall 134 and 144 of the load lock chamber 131 and the load lock chamber 141. Therefore, since a lifter mechanism configured to elevate a wafer may not necessarily be used to enhance cooling efficiency, a distance between the wafers W may be shortened. Accordingly, the number of the accommodated wafers W in the load lock chamber 131 and the load lock chamber 141 is increased. Also, the cost of equipment may be reduced.

(l) In the substrate processing apparatus according to this embodiment, the supporting surfaces 133S and 143S configured to support the wafer W on the substrate supports 133 and 143 are arranged in a higher position than the upper surface 172S of the auxiliary barrier unit 172. Therefore, since the wafer W does not come in contact with the auxiliary barrier unit 172, bending of the wafer W does not occur during a rapid cooling process, and the wafer W is not damaged.

(m) In the substrate processing apparatus according to this embodiment, the load lock chamber 131 and the load lock chamber 141 are configured to be reduced in pressure. Therefore, the wafer W may be transferred between the atmosphere transfer chamber 120 and the vacuum transfer chamber 110 without interrupting a vacuum atmosphere of the vacuum transfer chamber 110 through connection between the vacuum transfer chamber 110 and the atmosphere transfer chamber 120.

Second Embodiment of the Present Invention

Next, a second embodiment of the load lock chamber 131 and the load lock chamber 141 will be described as the second embodiment of the present invention with reference of FIGS. 9 through 13, as follows.

(Vacuum Intake Sequence of Load Lock Chamber)

Figure 9:
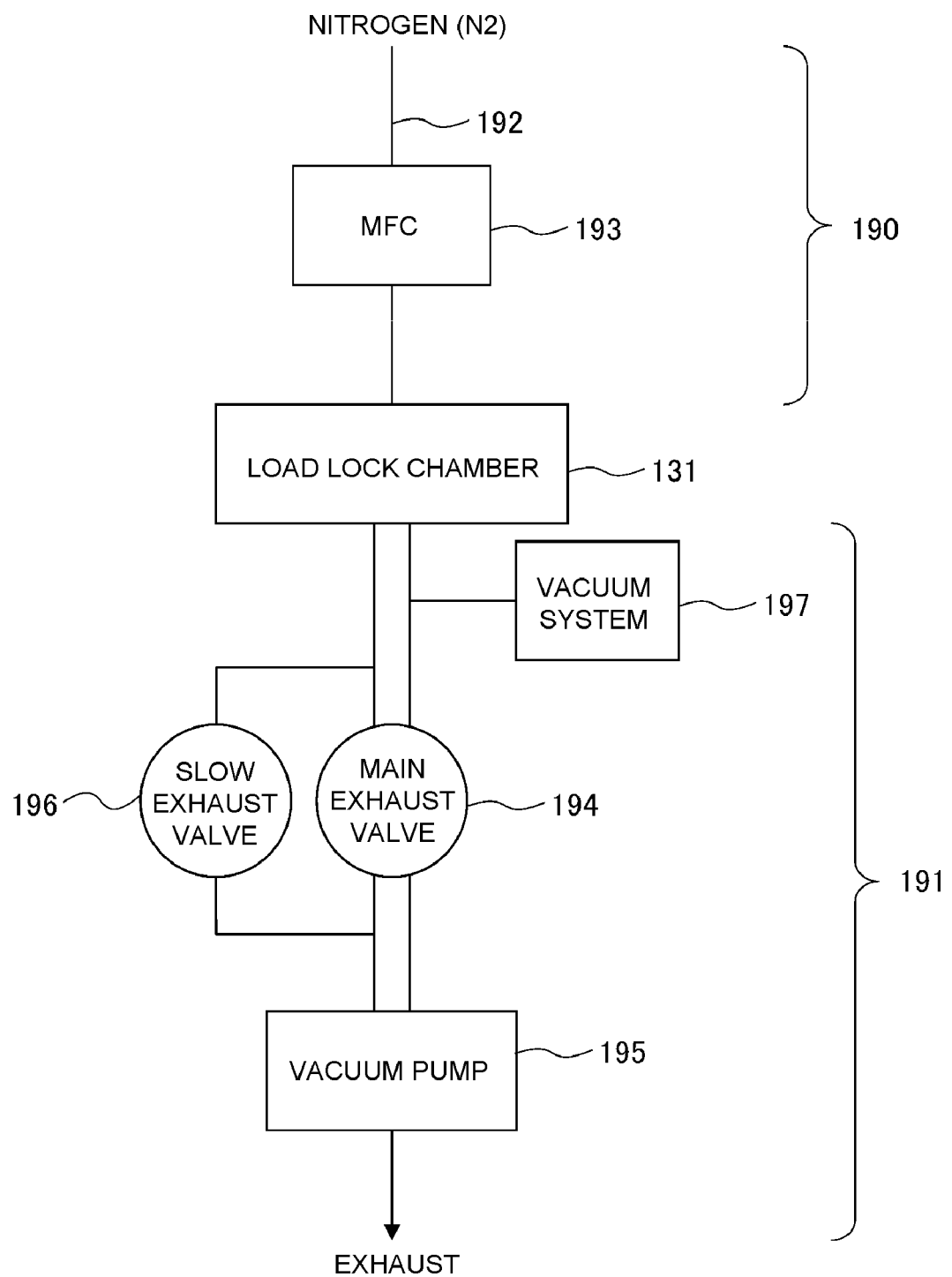
FIG. 9 is a block diagram exemplifying a configuration for exhausting a load lock chamber according to a second embodiment of the present invention.

FIG. 9 is a block diagram illustrating one example of a gas introduction system 190 and an exhaust system 191 of the load lock chamber 131 (141). As shown in FIG. 9, a piping 192 through which nitrogen gas is introduced is installed as the gas introduction system 190 at an upstream side of the load lock chamber 131 via an MFC 193 serving as a flow rate controller (a flow rate control unit). As the exhaust system 191, a vacuum pump 195 is connected to a downstream side of the load lock chamber 131 via a main exhaust valve 194. Also, a slow exhaust valve 196 is connected in parallel with the main exhaust valve 194. Also, a vacuum system 197 configured to measure a vacuum degree is connected between the load lock chamber 131 and the main exhaust valve 194.

Figure 10:
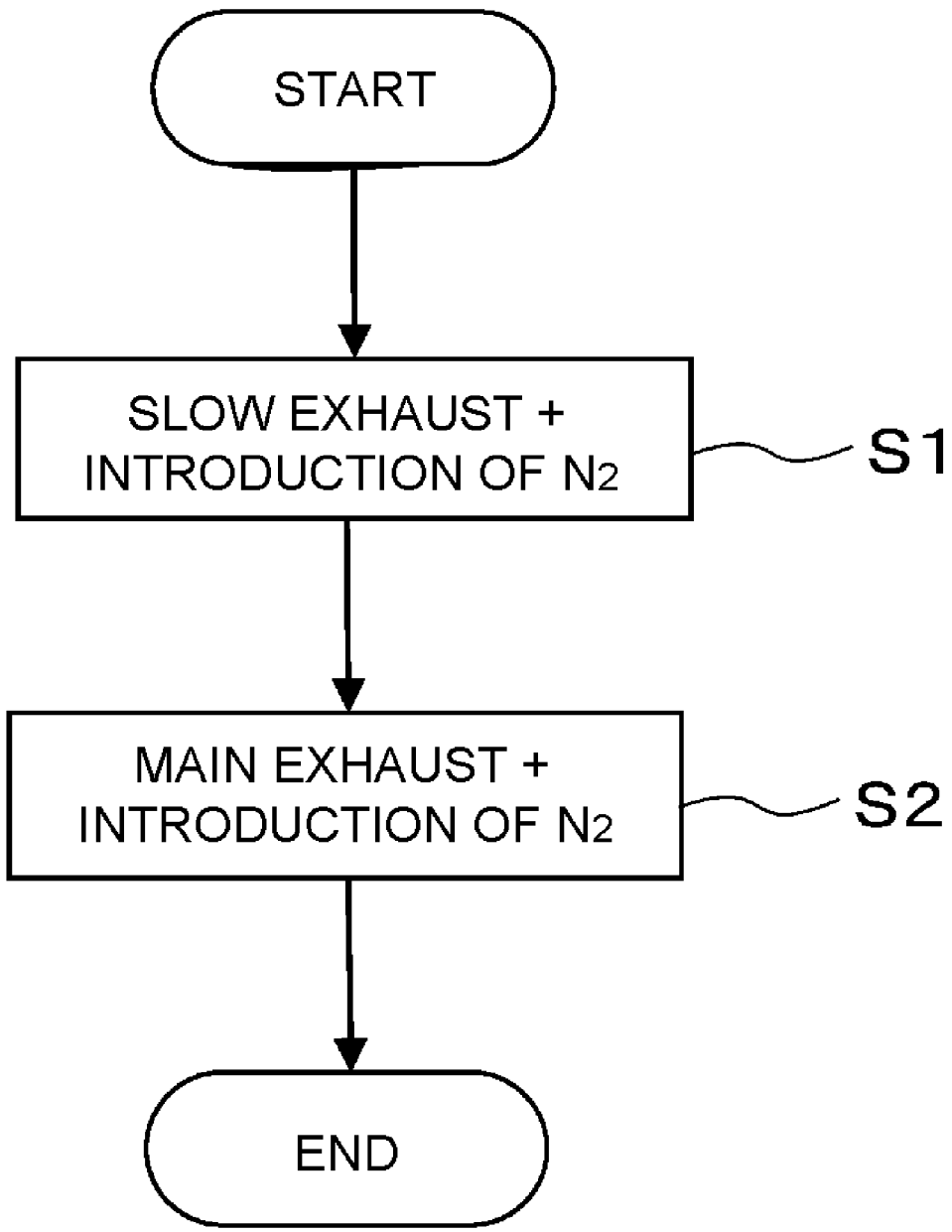
FIG. 10 is a flowchart illustrating a vacuum intake sequence of the load lock chamber according to the second embodiment of the present invention.
Figure 11:
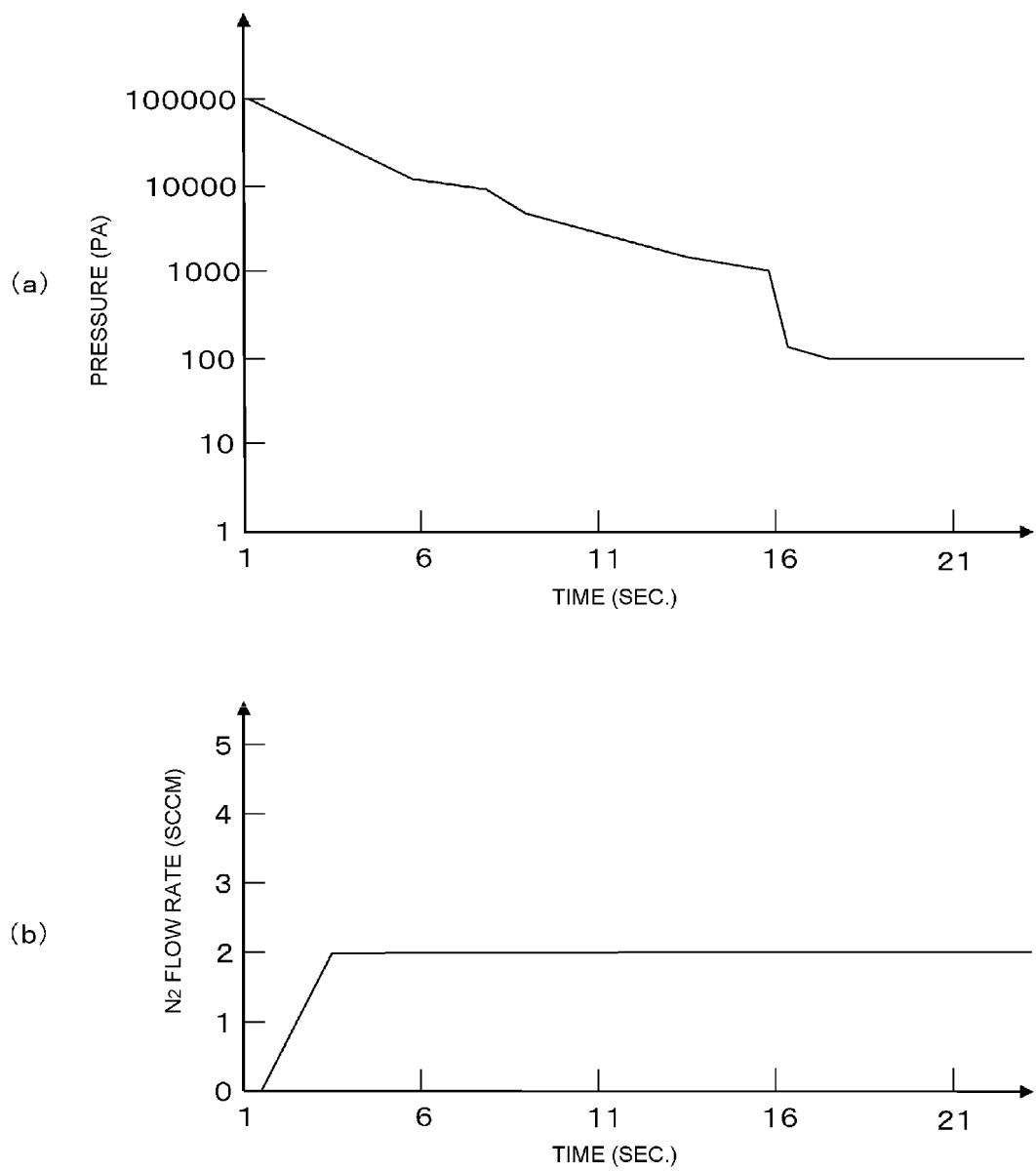
FIG. 11(a) is a diagram illustrating a relationship between pressure and time during vacuum intake of the load lock chamber according to the second embodiment of the present invention.
FIG. 11(b) is a diagram illustrating a relationship between a nitrogen flow rate and time.

Next, vacuum intake in the load lock chamber 131 will be described with reference to a flowchart of FIG. 10 illustrating a vacuum intake sequence, a diagram of FIG. 11(a) illustrating a relationship between pressure and time and a diagram of FIG. 11(b) illustrating a relationship between a nitrogen flow rate and time. For the vacuum intake in the load lock chamber 131, the main exhaust valve 194 is closed and the slow exhaust valve 196 is opened in a first step S1. In this condition, nitrogen gas is introduced from the piping 192. In this case, the MFC 193 controls a flow rate to, for example, 2 sccm. In this manner, the nitrogen gas is introduced into the load lock chamber 131, and, at the same time, the nitrogen gas introduced into the load lock chamber 131 is exhausted through the slow exhaust valve 196 using the vacuum pump 195. When reaching a predetermined vacuum degree, for example, 1000 Pa, a second step S2 is performed. In the second step S2, the main exhaust valve 194 is opened, the slow exhaust valve 196 is closed, and a flow rate is controlled to, for example, 2 seem while the nitrogen gas is introduced into the piping 192 in the same manner as described above. In this manner, the nitrogen gas is introduced into the load lock chamber 131, and, at the same time, the nitrogen gas introduced into the load lock chamber 131 is exhausted through the main exhaust valve 194 using the vacuum pump 195. In this case, a vacuum degree is measured by the vacuum system 197, and a vacuum exhaust process continues until the measured vacuum degree reaches a desired vacuum degree (for example, 100 Pa). When a measurement value measured at the vacuum system 197 reaches a vacuum degree of, for example, 100 Pa, the vacuum intake is stopped. The above-described vacuum intake sequence is instructed and performed by the above-described control unit 108.

Figure 12:
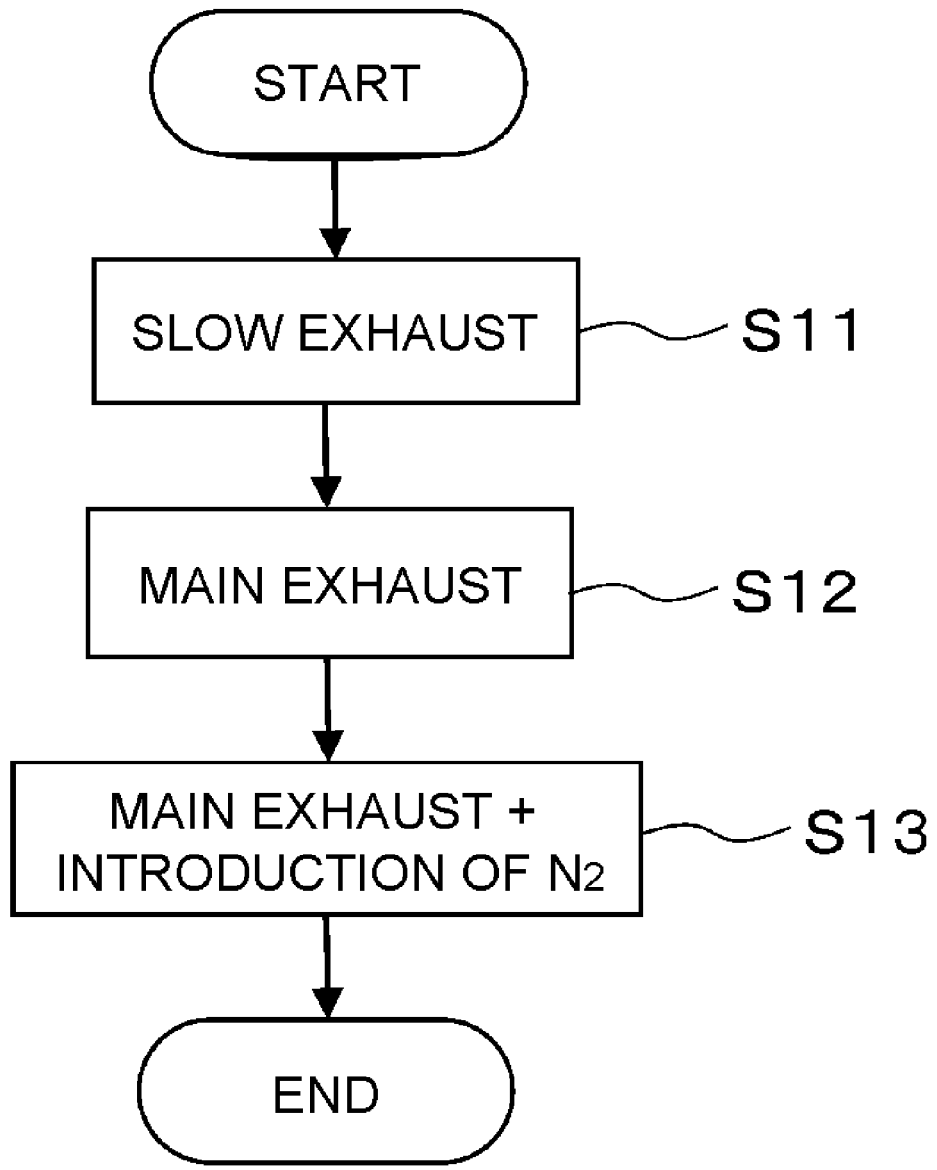
FIG. 12 is a flowchart illustrating a conventional vacuum intake sequence of a load lock chamber.
Figure 13:
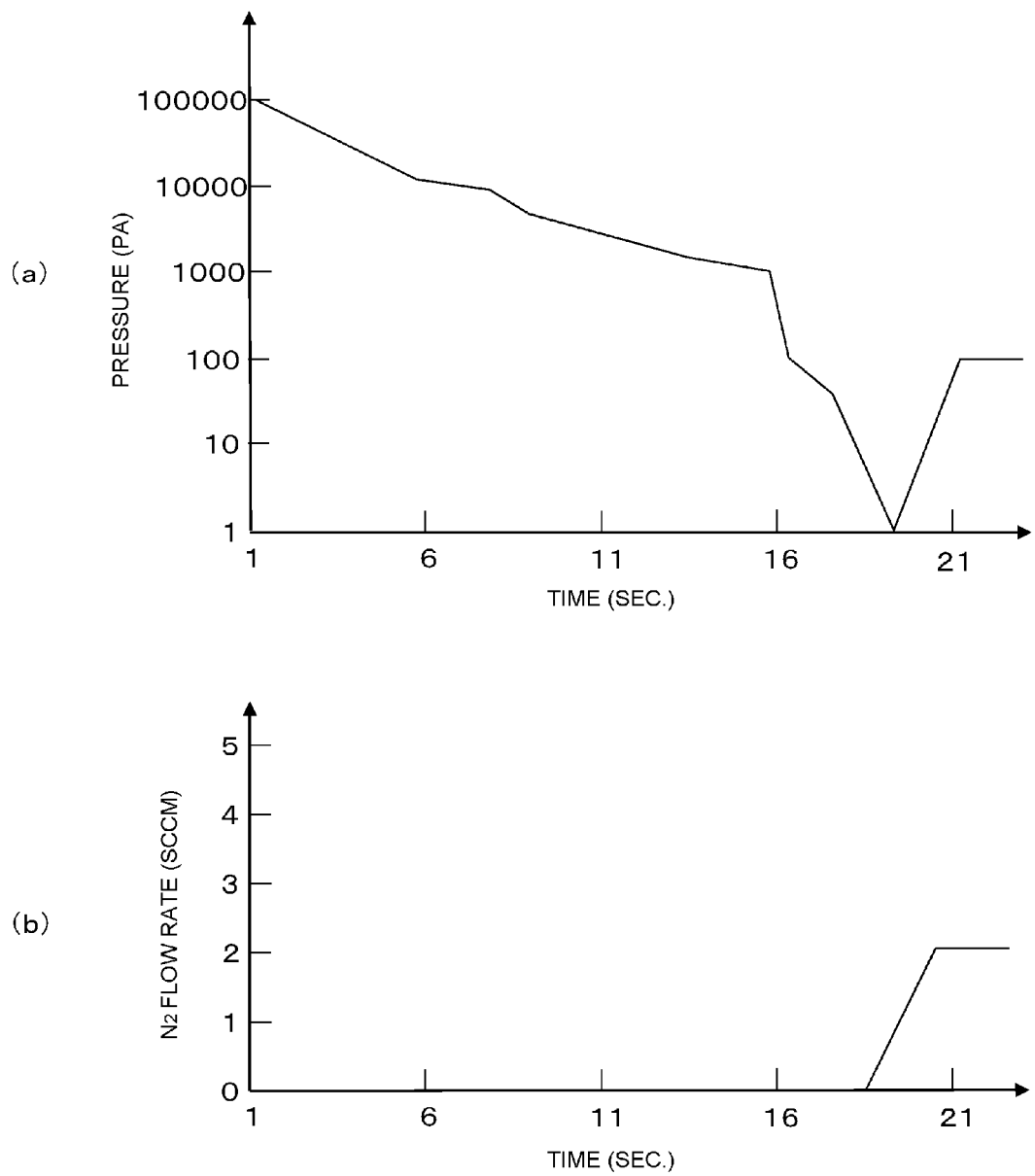
FIG. 13(a) is a diagram illustrating a relationship between pressure and time during conventional vacuum intake of the load lock chamber.
FIG. 13(b) is a diagram illustrating a relationship between a nitrogen flow rate and time.

Meanwhile, in the conventional vacuum intake sequence, a time when the load lock chamber 131 or 141 reaches a desired vacuum transfer pressure is approximately 22 seconds. The conventional vacuum intake sequence will be described with reference to a flowchart of FIG. 12 illustrating a vacuum intake sequence, a diagram of FIG. 13(a) illustrating a relationship between pressure and time and a diagram of FIG. 13(b) illustrating a relationship between a nitrogen flow rate and time. In a first step S11, for the vacuum intake in the load lock chamber 131, the main exhaust valve 193 is closed, the slow exhaust valve 195 is opened, and an atmosphere in the load lock chamber 131 is exhausted through the slow exhaust valve 195 without introducing nitrogen gas from the piping 191 using the vacuum pump 194. When reaching a predetermined vacuum degree, for example, 1000 Pa, a second step S12 is performed. In the second step S12, the main exhaust valve 193 is opened, the slow exhaust valve 195 is closed, and an atmosphere in the load lock chamber 131 is exhausted through the main exhaust valve 193 in the same manner as described above, without introducing nitrogen gas, using the vacuum pump 194. In this case, a vacuum degree is measured by the vacuum system 196, and a vacuum exhaust process continues until the measured vacuum degree reaches a desired vacuum degree (for example, 0.1 Pa). When the vacuum degree reaches 0.1 Pa, a third step S13 is performed. In the third step S13, the main exhaust valve 193 continues to be open, and, at the same time, the slow exhaust valve 195 continues to be closed, and nitrogen gas is introduced into the piping 191. In this case, a flow rate is controlled to, for example, 2 sccm by the MFC 192, and nitrogen gas is introduced into the load lock chamber 131. In turn, the nitrogen gas introduced into the load lock chamber 131 is exhausted through the main exhaust valve 193 using the vacuum pump 194. A vacuum degree is measured by the vacuum system 196 during the exhaust process, and the vacuum exhaust process continues until the measured vacuum degree reaches a predetermined vacuum degree (for example, 100 Pa). Then, when a measurement value measured at the vacuum system 196 reaches a vacuum degree of, for example, 100 Pa, the vacuum intake is stopped.

As described above, the vacuum intake sequence in which nitrogen gas flows is used at the beginning step, and the vacuum intake by the main exhaust is not checked. Therefore, an atmosphere in the load lock chamber 131 and 141 may be changed from an atmospheric pressure to a desired vacuum transfer pressure within a short time of approximately 16 seconds. Therefore, throughput may be improved.

Third Embodiment of the Present Invention

Next, an embodiment of the vacuum transfer chamber 110 will be described as a third embodiment of the present invention with reference to FIGS. 14 and 15.

(Opening/Closing of Ceiling Wall of Vacuum Transfer Chamber)

Figure 14:
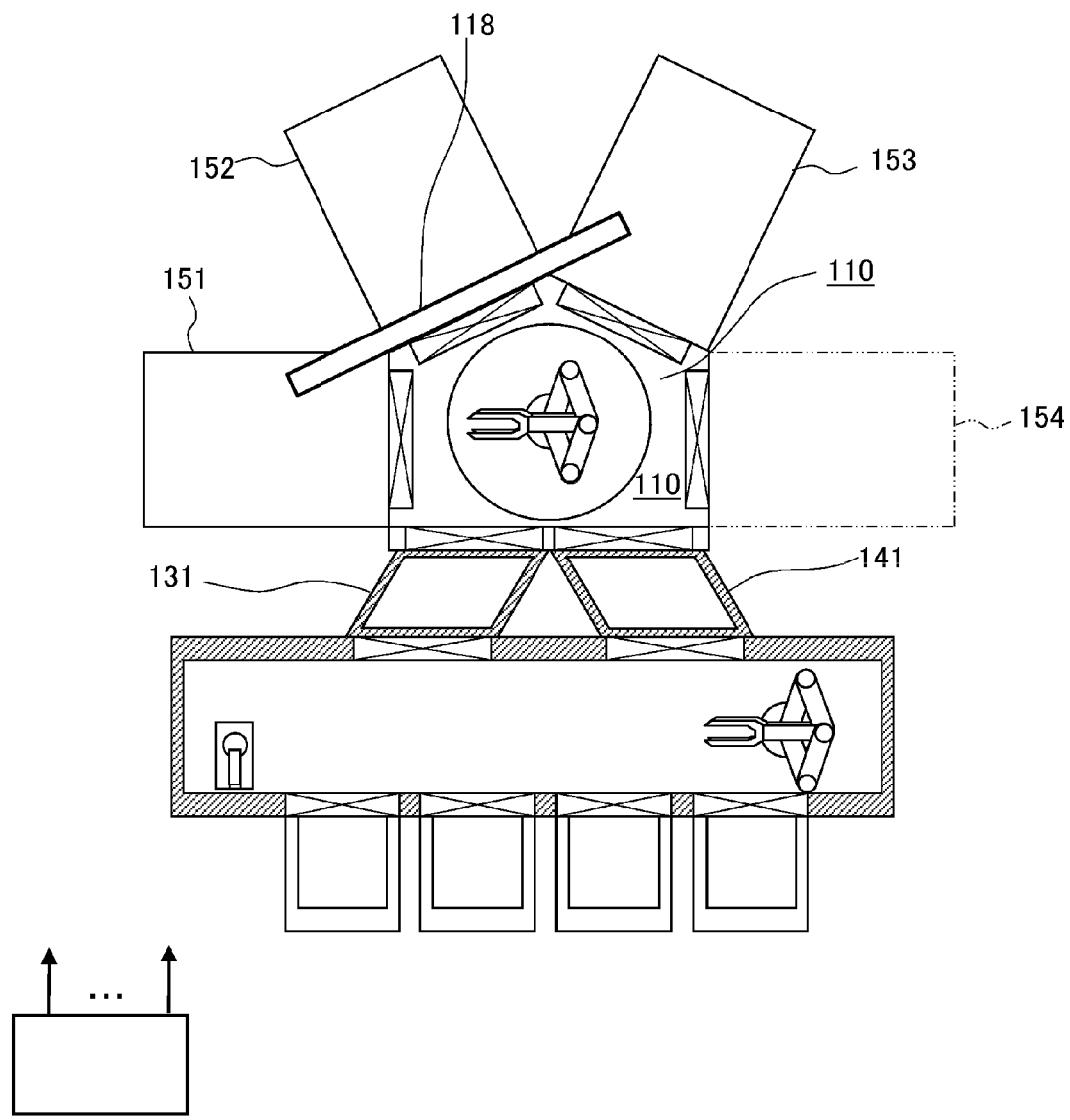
FIG. 14 is a top cross-sectional view illustrating opening/closing directions of a ceiling wall of a load lock chamber according to a third embodiment of the present invention.

FIG. 14 is a top cross-sectional view illustrating an opening direction of an upper lid 118 of the vacuum transfer chamber 110. As shown in FIG. 14, the upper lid 118 of the vacuum transfer chamber 110 is configured so that an opening/closing direction can be set freely. For example, a rotary support (not shown) is installed to pivotally open the upper lid 118 at each side of the process chamber 151, the process chamber 152, the process chamber 153, the process chamber 154, the load lock chamber 131 and the load lock chamber 141. In the drawings, a state in which the process chamber 154 is separated is shown, and a state in which the upper lid 118 is opened toward the process chamber 152 is shown. In these states, a work area may be set up in the separated process chamber 154 when a maintenance task of the vacuum transfer chamber 110 is performed. Since the upper lid 118 is opened toward the process chamber 152, the work area may be set up between the process chamber 151 and the load lock chamber 131, and set up in a side of the process chamber 153 adjacent to the process chamber 154 and a side of the load lock chamber 141 adjacent to the process chamber 154.

Figure 15:
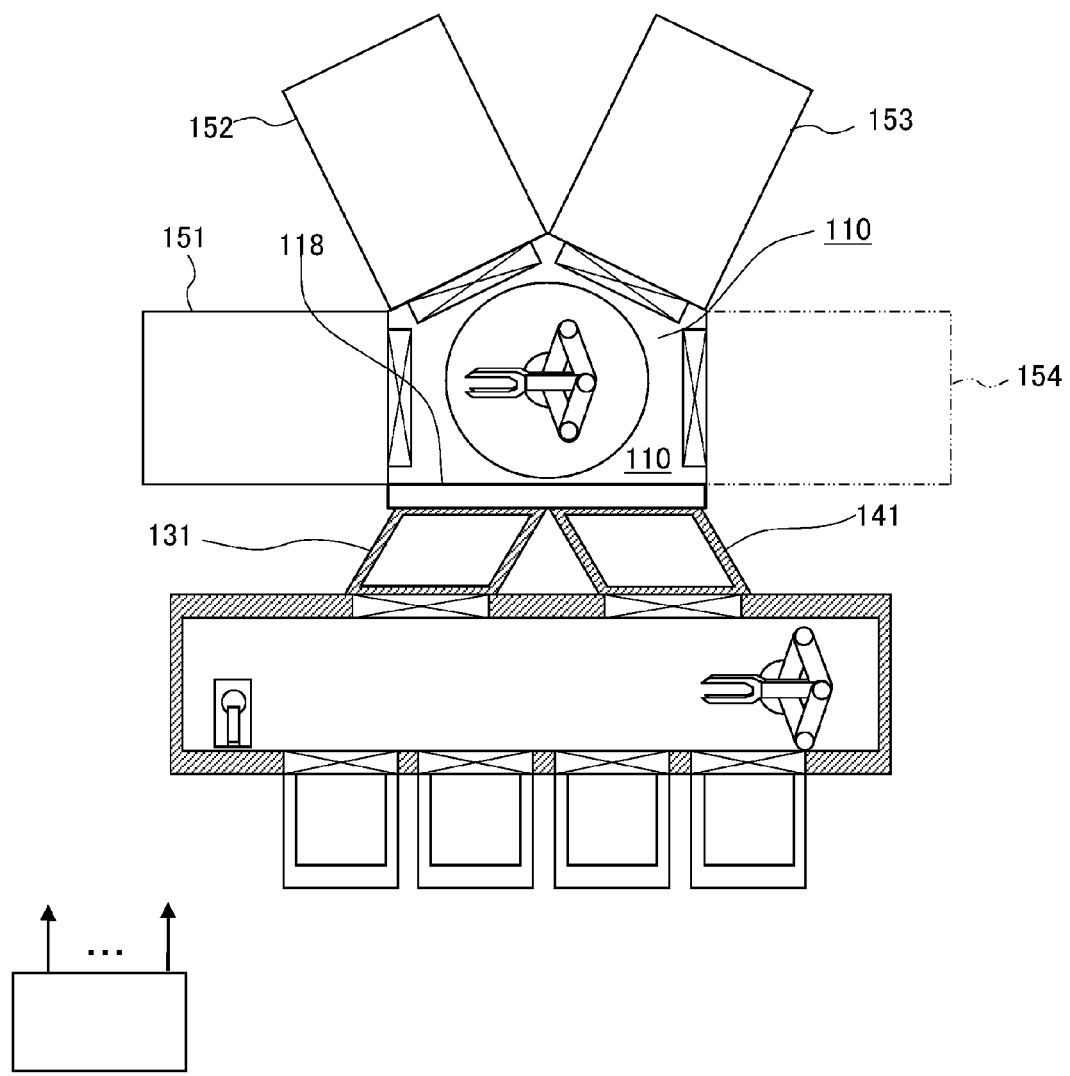
FIG. 15 is a top cross-sectional view illustrating conventional opening/closing directions of a ceiling wall of a load lock chamber.

Also, FIG. 15 is a top cross-sectional view illustrating an opening direction of an upper lid 118 of a conventional vacuum transfer chamber 110. As shown in FIG. 15, the upper lid 118 of the vacuum transfer chamber 110 is configured to be able to be opened toward only the load lock chamber 131 and the load lock chamber 141. Accordingly, in a state where the upper lid 118 is opened toward the load lock chamber 131 and the load lock chamber 141, a work area when a maintenance task of the vacuum transfer chamber 110 is performed may be set up in the separated process chamber 154. However, setting the upper lid 118 in the load lock chamber 131 and the load lock chamber 141 is difficult. Also, setting up the work area between the process chamber 151 and the process chamber 152 and between the process chamber 152 and the process chamber 153 is difficult. Also, workability in the load lock chamber 131 and the load lock chamber 141 is degraded by the upper lid 118 opened toward the load lock chamber 131 and the load lock chamber 141.

Therefore, since the upper lid 118 of the vacuum transfer chamber 110 is configured to be able to be opened in various directions as described above, a work area for a maintenance task is enlarged other than a region in which the process chamber 154 is separated. Therefore, work efficiency of the maintenance task may be improved. Also, since the maintenance task may be performed from a widely open side, the work efficiency may be further improved, a working time may be shortened, and a device operation rate including a maintenance time may be improved. Also, when the process chambers 151 through 154 are connected to the vacuum transfer chamber 110, a maintenance task is difficult to perform even in any rear direction of the process chambers 151 through 154. In this case, when the upper lid 118 is opened toward the process chamber 152 or the process chamber 153 from which the maintenance task is difficult to perform in the rear direction, work areas may be ensured between the process chamber 151 and the load lock chamber 131 and between the process chamber 154 and the load lock chamber 141.

Fourth Embodiment of the Present Invention

Figure 16:
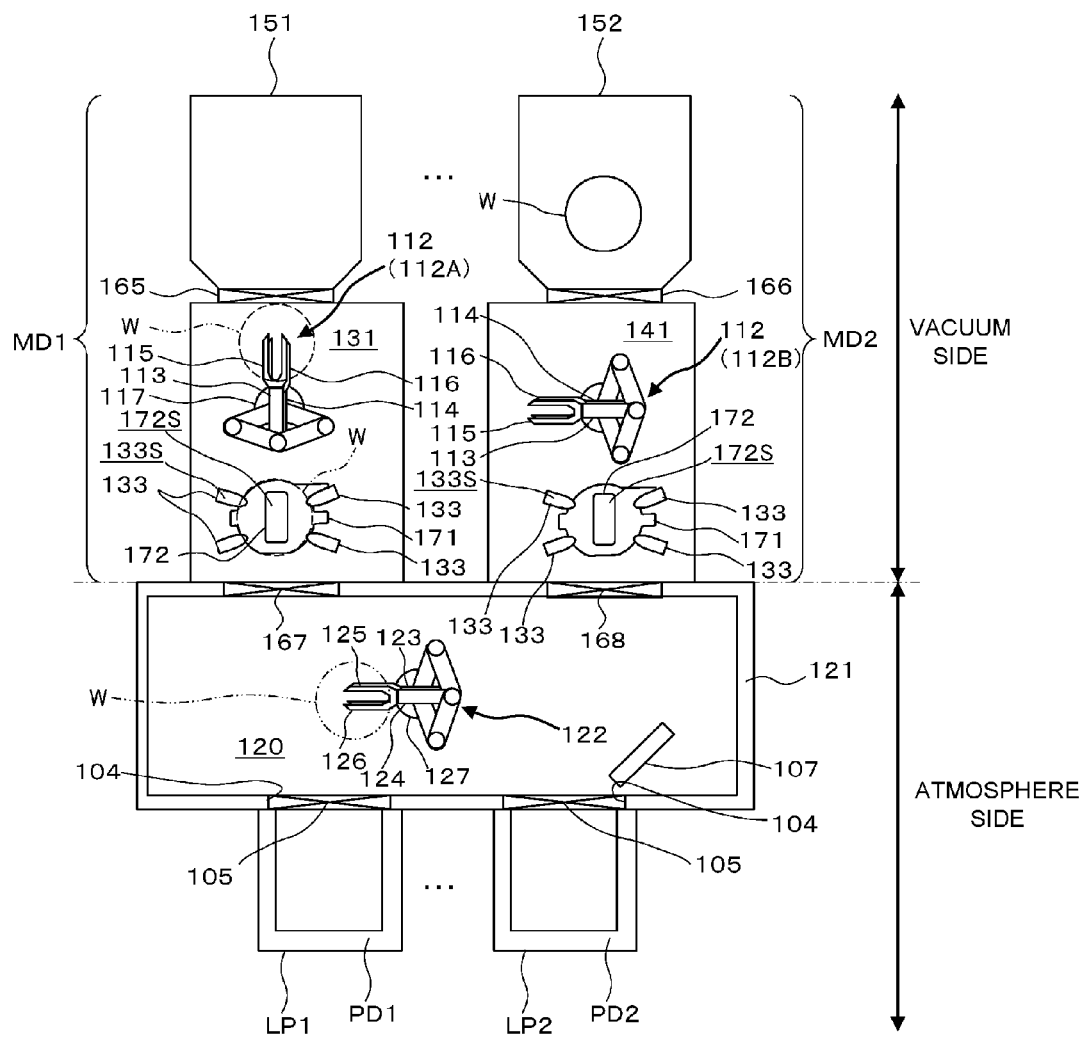
FIG. 16 is a top cross-sectional view illustrating an outline configuration of a substrate processing apparatus according to a fourth embodiment of the present invention.

Next, a configuration of the substrate processing apparatus according to a fourth embodiment of the present invention is shown in FIG. 16. FIG. 16 is a top cross-sectional view illustrating an outline configuration of an in-line type substrate processing apparatus according to the fourth embodiment of the present invention. The in-line type substrate processing apparatus is also divided into a vacuum side and an atmosphere side.

(Configuration of Vacuum Side)

Two substrate processing modules MD1 and MD2 are installed in parallel at the vacuum side of the in-line type substrate processing apparatus. The substrate processing module MD1 includes a process chamber 151 serving as a process chamber configured to process a wafer W as a substrate, and a load lock chamber 131 installed at a front end of the process chamber 151. The substrate processing module MD2 also includes a process chamber 152 and a load lock chamber 141 in the same manner as in the substrate processing module MD1.

The process chambers 151 and 152 are configured to process the wafer W in the same manner as in the above-described cluster-type substrate processing apparatus, for example, by performing a process of forming a thin film on a wafer W, a process of forming an oxide film or a nitride film on a surface of the wafer W, or a process of forming a metal thin film on the wafer W, for example, using a CVD method, an ALD method or a PVD method.

A gas supply source (not shown), an MFC configured to control a flow rate of a process gas supplied from the gas supply source, a gas introduction mechanism provided with a valve, an APC (not shown) configured to control a pressure in the process chambers 151 and 152, a gas exhaust mechanism provided with a pressure sensor, a temperature matching machine (not shown) configured to control a temperature in the process chambers 151 and 152, an input/output valve I/O configured to control a supply of a process gas (not shown) or an On/Off operation of an exhaust valve, and a plasma discharge mechanism configured to supply high-frequency electric power to generate plasma in the process chambers 151 and 152 are installed at the process chambers 151 and 152.

The load lock chamber 131 and the load lock chamber 141 function as spare chambers configured to transfer the wafer W into each of the process chambers 151 and 152 or spare chambers and cooling chambers configured to transfer the wafer W from the process chambers 151 and 152 and cool the wafer W.

Vacuum transfer robots 112 (112A and 112B) serving as vacuum transfer mechanisms are installed in the load lock chamber 131 and the load lock chamber 141, respectively. The vacuum transfer robot 112A is configured to transfer the wafer W between the process chamber 151 and the load lock chamber 131, and the vacuum transfer robot 112B is configured to transfer the wafer W between the process chamber 152 and the load lock chamber 141. Also, a first transfer arm 113 and a second transfer arm 114 configured to be able to transfer two wafers W at the same time is installed at these vacuum transfer robots 112. The vacuum transfer robots 112 are configured to put the wafer W on a first end effector 115 and a second end effector 116, which constitute ends of the first transfer arm 113 and the second transfer arm 114, respectively, and transfer the wafer W between the load lock chamber 131 and the process chamber 151 and between the load lock chamber 141 and the process chamber 152. Also, the vacuum transfer robots 112 are configured to go up and down on an elevator 117 while maintaining air tightness of the vacuum transfer chamber 110. Also, a wafer presence sensor (not shown) serving as a substrate detection unit configured to detect the presence of the wafer W is installed in a predetermined position (for example, in the vicinity of a gate valve) in front of the load lock chamber 131, the load lock chamber 141 and the process chambers 151 and 152.

The load lock chamber 131 and the load lock chamber 141 are connected to the process chambers 151 and 152 via a gate valve 165 and a gate valve 166, respectively. Also, the load lock chamber 131 and the load lock chamber 141 are connected to an atmosphere transfer chamber 120 to be described later via a gate valve 167 and a gate valve 168, respectively. Therefore, when the gate valve 167 and the gate valve 168 are opened while the gate valve 165 and the gate valve 166 are closed, the wafer W may be transferred between the load lock chamber 131 and the process chamber 151 and between the load lock chamber 141 and the process chamber 152 while holding vacuum hermeticity in the process chambers 151 and 152.

Also, the load lock chamber 131 and the load lock chamber 141 are configured in a load lock chamber structure which can endure a reduced pressure lower than atmospheric pressure such as a vacuum state, and insides of the load lock chamber 131 and the load lock chamber 141 may be vacuum-exhausted. Therefore, when the gate valve 167 and the gate valve 168 are closed to vacuum-exhaust the insides of the load lock chamber 131 and the load lock chamber 141 and the gate valve 165 and the gate valve 166 are then opened, the wafer W may be transferred between the load lock chamber 131 and the load lock chamber 141, and the atmosphere transfer chamber 120 while holding a vacuum state in the process chambers 151 and 152.

A barrier 171 is provided in the load lock chamber 131 and the load lock chamber 141, and arranged between the wafers W accommodated in the load lock chamber 131 and the load lock chamber 141 to be spaced apart from the wafers W and interrupt heat transfer between the wafers W.

The barrier 171 includes an auxiliary barrier unit 172 configured to absorb radiant heat of the wafer W arranged on the barrier 171. The auxiliary barrier unit 172 is installed in a region other than a movement region of each of the first transfer arm 113 including the first end effector 115 and a third transfer arm 123 including a third end effector 125 (not shown), so that the auxiliary barrier unit 172 can be close to the wafer W accommodated in an upper portion of the barrier 171. The auxiliary barrier unit 172 may be configured to be installed on the barrier 171 separately from the barrier 171, or may be configured to be installed integrally with the barrier 171. Also, the barrier 171 may be configured to be installed around the auxiliary barrier unit 172.

Also, substrate supports 133 and 143 configured in a plural number (4 in the drawings) to support a plurality of wafers W in multiple stages are installed in the load lock chamber 131 and the load lock chamber 141 so that the substrate supports 133 and 143 can be fixed to bottom walls 134 and 144 of the substrate supports 133 and 143, respectively. Each of upper supporting surfaces 133S and 143S configured to support the wafer W on the substrate supports 133 and 143 is arranged in a higher position than an upper surface 172S of the auxiliary barrier unit 172.

A distance between the auxiliary barrier unit 172 and the wafer W accommodated directly on the auxiliary barrier unit 172 is the same as in the above-described first embodiment, and set to a range of 0.5 mm and 2 mm.

Also, auxiliary bottom wall units (not shown) identical to the auxiliary barrier unit 172 are installed at bottom walls (not shown) of the load lock chamber 131 and the load lock chamber 141. The auxiliary bottom wall units are identical to the auxiliary bottom wall unit 173 described with reference to FIG. 6, and set to a range of 0.5 mm and 2 mm.

(Configuration of Atmosphere Side)

An atmosphere transfer chamber 120 serving as a second transfer chamber connected to the load lock chamber 131 and the load lock chamber 141, and load ports LP1 and LP2 serving as substrate accommodation units configured to place substrate accommodation containers (hereinafter, referred to as pods PD1 and PD2) connected to the atmosphere transfer chamber 120 are installed at the atmosphere side of the in-line type substrate processing apparatus.

One atmosphere transfer robot 122 serving as a second transfer mechanism is installed in the atmosphere transfer chamber 120. A third transfer arm 123 and a fourth transfer arm 124 configured to transfer two wafers W at the same time are installed at the atmosphere transfer robot 122. The atmosphere transfer robot 122 is configured to put the wafer W on a third end effector 125 and a fourth end effector 126, which constitute ends of the third transfer arm 123 and the fourth transfer arm 124, respectively, and transfer the wafer W between the load lock chamber 131 and the load lock chamber 141, and the pods PD1 and PD2 placed on the load ports LP1 and LP2. Also, the atmosphere transfer robot 122 is configured to go up and down on an elevator 127, and simultaneously reciprocate in left and right directions by means of a linear actuator 128 (not shown) serving as a movement device. Also, a wafer presence sensor (not shown) serving as a substrate detection unit configured to detect the presence of the wafer W is installed in a predetermined position (for example, in the vicinity of a gate valve) in front of the atmosphere transfer chamber 120

Also, a notch adjusting device 107 serving as a substrate position correction device and configured to perform positional adjustment of a crystal orientation of the wafer W using a notch formed on the wafer W is installed in the atmosphere transfer chamber 120. Instead of the notch adjusting device 107, an orientation flat adjusting device (not shown) configured to perform the positional adjustment of the crystal orientation of the wafer W may be installed.

A wafer transfer port 104 configured to load and unload the wafer W with respect to the atmosphere transfer chamber 120 is formed at a housing 121 of the atmosphere transfer chamber 120. The load ports LP1 and LP2 configured to place the pods PD1 and PD2 accommodating a plurality of wafers W are provided outside the housing 121 of the atmosphere transfer chamber 120 in a lower portion of the wafer transfer port 104. Also, a pod opener (not shown) configured to perform opening/closing operations of a lid 105 opening and closing the wafer transfer port 104 and caps (not shown) of the pods PD1 and PD2 placed on the load ports LP1 and LP2 is installed in the atmosphere transfer chamber 120. Also, the pods PD1 and PD2 are loaded and unloaded with respect to the load ports LP1 and LP2 using an in-process transfer device (not shown, AGV/OHT). The load ports LP1 and LP2 may place the pods PD1 and PD2, respectively.

In the description, two process chambers 151 and 152, two load lock chambers 131 and 141 and two load ports LP1 and LP2 are shown, but at least three process chambers 151 and 152, at least three load lock chambers 131 and 141 and at least three load ports LP1 and LP2 may be installed.

The above-described in-line type substrate processing apparatus may also have the same effect as the above-described cluster-type substrate processing apparatus.

In the above-described cluster-type substrate processing apparatus and the in-line type substrate processing apparatus, two wafers W may be placed in the load lock chamber 131 and the load lock chamber 141, but the substrate support 133 may be configured to place at least three wafers W in the load lock chamber 131 and the load lock chamber 141. In this case, the barrier 171 including the same auxiliary barrier unit 172 as described above is installed between the wafers W placed at an upper end side of the substrate support 133. Also, the auxiliary bottom wall unit 173 is installed at the bottom walls of the load lock chamber 131 and the load lock chamber 141 in the same manner as described above.

Other Embodiments of the Present Invention

Next, second and third examples of a process furnace will be described as the other embodiments of the present invention with reference to FIGS. 17 and 18.

(Second Example of Process Furnace)

Figure 17:
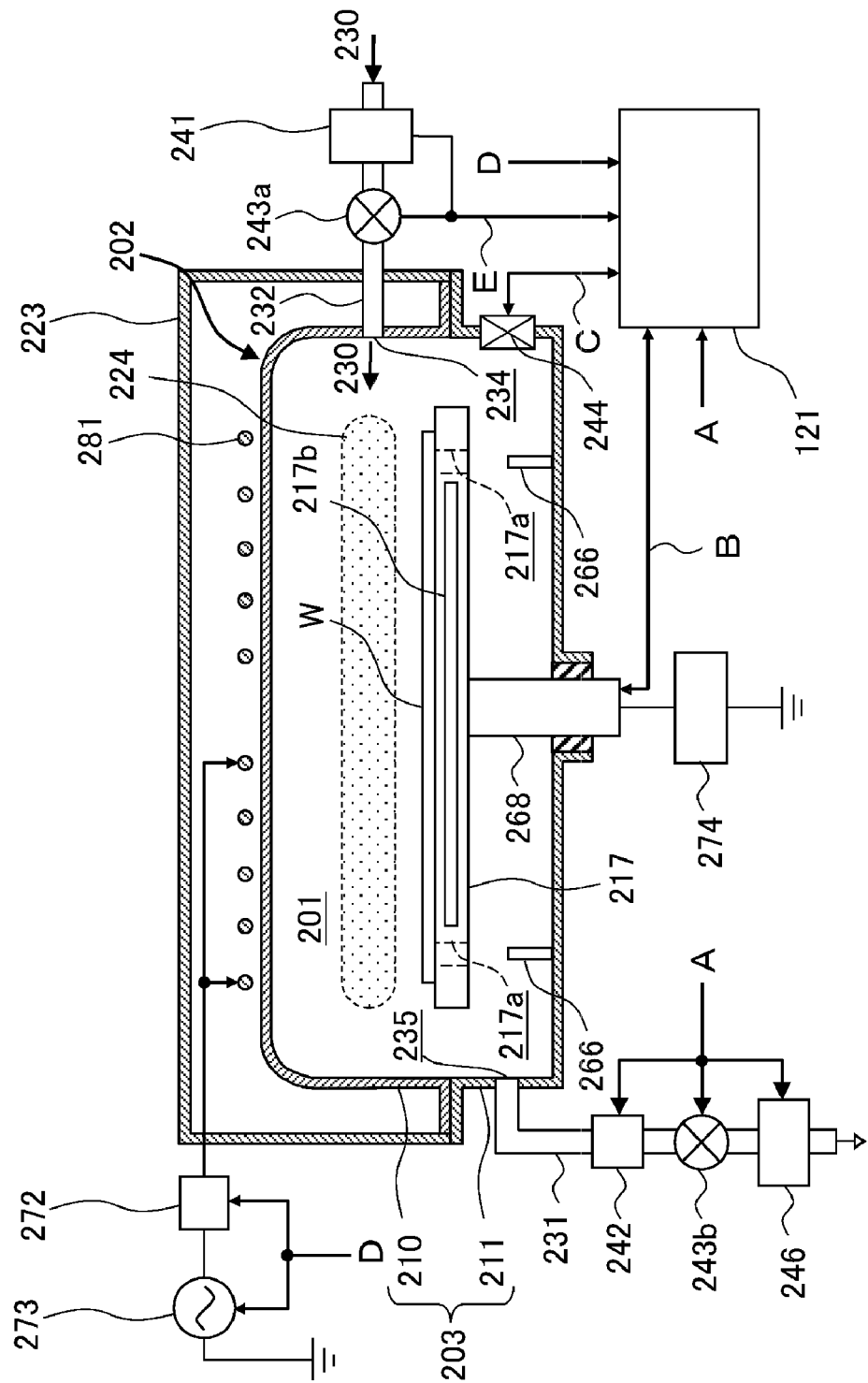
FIG. 17 is a schematic cross-sectional view illustrating a second example of a process furnace according to another embodiment of the present invention.

FIG. 17 shows a schematic cross-sectional view of an MMT device according to the second example. The MMT device includes a process container 203 having a process chamber 201 formed therein. The process container 203 includes a dome-like upper container 210 serving as a first container and a bowl-type lower container 211 serving as a second container. In turn, the upper container 210 covers the lower container 211. The upper container 210 is made of a metallic material such as aluminum oxide, aluminum nitride or quartz. The lower container 211 is formed of, for example, aluminum. Also, a susceptor 217 which is a heater-integrated substrate holding port (a substrate holding unit) to be described later is also provided. When the susceptor 217 is formed of a non-metallic material such as aluminum nitride, ceramics or quartz, contamination of metals introduced into a film of a wafer W serving as a substrate is reduced during the process.

A high-frequency coil 281 is installed at an upper outer side of the upper container 210. A high-frequency electric power source 273 configured to apply high-frequency electric power is connected to the high-frequency coil 281 via a matching machine 272 configured to perform an impedance matching process.

A gas introduction port 234 through which a gas is introduced is installed at a sidewall of the upper container 210. A gas supply pipe 232 configured to supply a gas is connected to the gas introduction port 234. The gas supply pipe 232 is connected to a gas cylinder (not shown) serving as a supply source of a reactive gas 230 via a valve 243a serving as an opening/closing valve and an MFC 241 serving as a flow rate controller (a flow rate control unit).

A gas exhaust port 235 serving as an exhaust port configured to exhaust a gas is installed at a sidewall of the lower container 211 so that the reactive gas 230 can be supplied from the above-described gas introduction port 234 to a process chamber 201, and the gas remaining after processing of the substrate flows from surroundings of the susceptor 217 in a bottom direction of the process chamber 201. The gas exhaust port 235 is connected to a vacuum pump 246 serving as an exhaust device via an APC 242 serving as a pressure regulator and a valve 243b serving as an opening/closing valve through a gas exhaust pipe 231 serving as an exhaust pipe configured to exhaust a gas.

Generally, a gas supply unit includes the MFC 241, the valve 243a, the gas supply pipe 232 and the gas introduction port 234. Also, a gas exhaust unit includes the gas exhaust port 235, the gas exhaust pipe 231, the APC 242, the valve 243b and the vacuum pump 246.

For example, the above-described high-frequency coil 281 formed in a planar coil shape is installed as an electric discharge mechanism configured to excite the supplied reactive gas 230. Since the high-frequency coil 281 is installed at an upper outer side of the process container 203 (the upper container 210), the high-frequency coil 281 is arranged above a plasma generation region 224 generated in the process chamber 201. The high-frequency electric power source 273 configured to apply high-frequency electric power is connected to the high-frequency coil 281 via the matching machine 272 configured to perform impedance adjustment. A high-frequency electric power supply source configured to apply high-frequency electric power from the above-described matching machine 272 and the high-frequency electric power source 273 to the high-frequency coil 281 is provided. As described above, the electric discharge mechanism generally includes the high-frequency coil 281, the matching machine 272 and the high-frequency electric power source 273.

The susceptor 217 serving as a substrate holding port (a substrate holding unit) configured to hold a wafer W as a substrate is arranged at a bottom central region of the process chamber 201. Since a heater 217b serving as a heating mechanism (a heating unit) is integrally buried in an inner part of the susceptor 217, the heater 217b may be configured to heat the wafer W. When electric power is applied to the heater 217b, the heater 217b may heat the wafer W to a temperature of, for example, approximately 700° C. to 800° C.

Also, an electrode-built-in susceptor (not shown) serving as an electrode configured to change impedance is provided in the susceptor 217. The electrode-built-in susceptor is grounded via an impedance variable mechanism 274. The impedance variable mechanism 274 includes a coil or a variable condenser. The impedance variable mechanism 274 may control a potential of the wafer W via the electrode-built-in susceptor and the susceptor 217 by controlling a pattern number of the coil or a capacity value of the variable condenser. The electrode-built-in susceptor and the impedance variable mechanism 274 mounted in the above-described susceptor 217 are also included in the above-described electric discharge mechanism.

A process furnace 202 configured to process the wafer W by electric discharge in the high-frequency plasma source generally includes the process chamber 201, the process container 203, the susceptor 217, the high-frequency coil 281, the gas introduction port 234 and the gas exhaust port 235, and thus plasma processing of the wafer W in the process chamber is possible.

A shielding box 223 configured to effectively shield an electric field is installed around the high-frequency coil 281 so that the electric field formed in the high-frequency coil 281 cannot have an adverse effect on an external environment or other devices such as a process furnace.

The susceptor 217 is insulated from the grounded lower container 211, and a susceptor elevating mechanism (an elevating unit 268) configured to elevate the susceptor 217 is provided. Also, a through hole 217a is installed at the susceptor 217, and wafer elevating pins 266 configured to push up the wafer W is installed in at least three places at a bottom surface of the lower container 211. In turn, when the susceptor 217 is lowered by the susceptor elevating mechanism 268, the through hole 217a and the wafer elevating pins 266 are arranged so that the wafer elevating pins 266 can pass through the through hole 217a in a state where the wafer elevating pins 266 do not come in contact with the susceptor 217.

Also, a gate valve 244 which is an opening/closing valve is installed at a sidewall of the lower container 211, the wafer W may be loaded or unloaded with respect to the process chamber 201 by a transfer mechanism (a transfer unit, not shown) when the gate valve 244 is kept open, and the process chamber 201 may be hermetically closed when the gate valve 244 is kept closed.

Also, a controller 121 serving as a control unit is configured to control the APC 242, the valve 243b and the vacuum pump 246 through a signal line A, control the susceptor elevating mechanism 268 through a signal line B, control the gate valve 244 through a signal line C, control the matching machine 272 and the high-frequency electric power source 273 through a signal line D, control the MFC 241 and the valve 243a through a signal line E, and control the heater 217b and the impedance variable mechanism 274, both of which are buried in the susceptor 217, through a signal line (not shown).

In the second example of the above-described process furnace 202, the high-frequency coil 281 is used as an excitation unit, and a gas in the process chamber 201 supplied from the gas introduction port 234 is excited to generate plasma and process a substrate.

(Third Example of Process Furnace)

Figure 18:
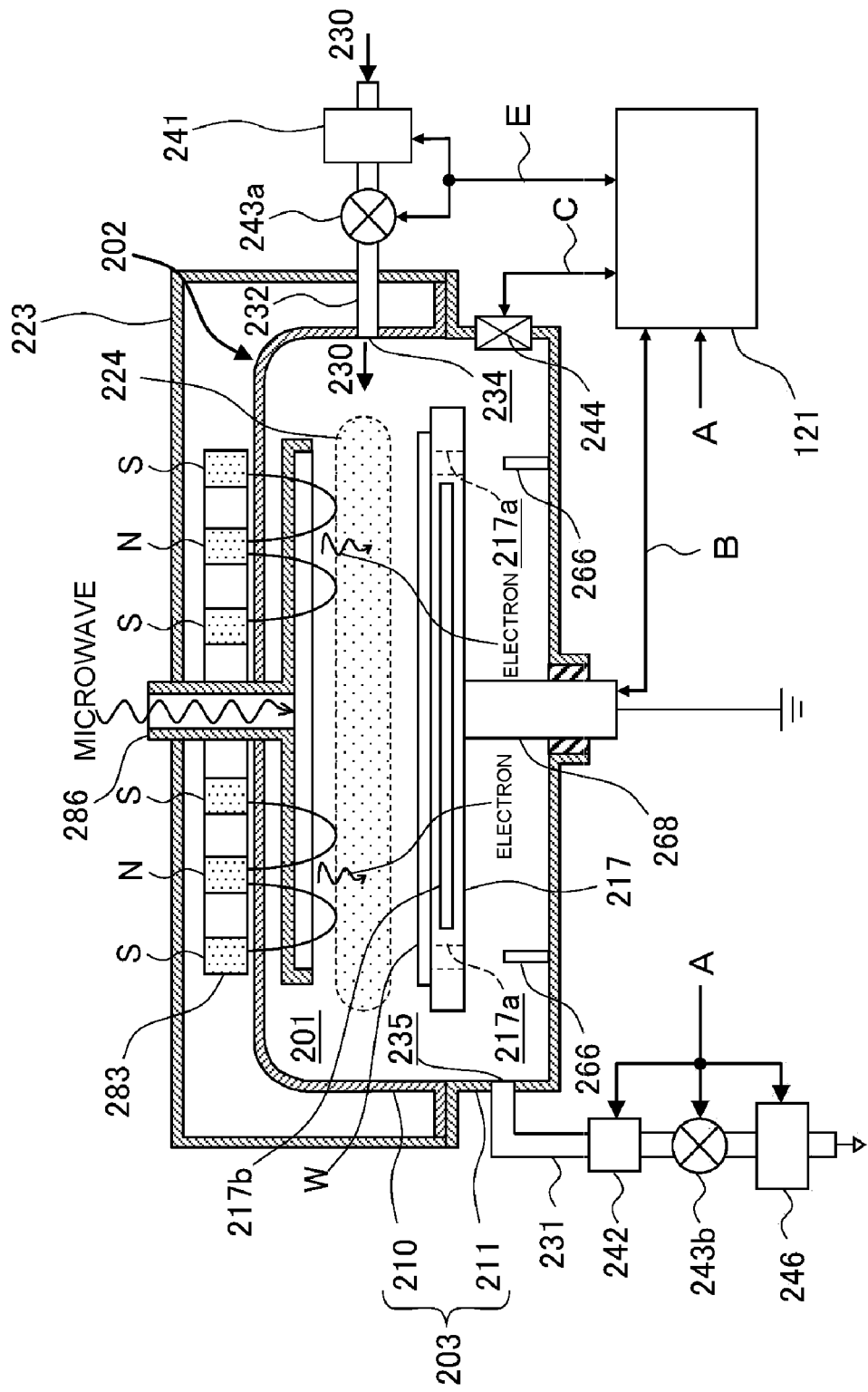
FIG. 18 is a schematic cross-sectional view illustrating a third example of a process furnace according to still another embodiment of the present invention.

FIG. 18 shows a schematic cross-sectional view of an MMT device according to the third example. The MMT device includes a process container 203 having a process chamber 201 formed therein. The process container 203 includes a dome-like upper container 210 serving as a first container and a bowl-type lower container 211 serving as a second container. In turn, the upper container 210 covers the lower container 211. The upper container 210 is made of a non-metallic material such as aluminum oxide, aluminum nitride or quartz. The lower container 211 is formed of, for example, aluminum. Also, a susceptor 217 serving as a heater-integrated substrate holding port (a substrate holding unit) to be described later is provided. When the susceptor 217 is formed of a non-metallic material such as aluminum nitride, ceramics or quartz, contamination of metals introduced into a film of a wafer W serving as a substrate may be reduced during the process.

A magnet 283 serving as an excitation unit is installed at an upper outer side of the upper container 210. Also, a microwave introduction unit 285 is installed at an upper portion of the process chamber 201 of the upper container 210. A waveguide 286 through which microwaves are guided from an upper outer portion of the upper container 210 is installed at an upper portion of the microwave introduction unit 285. A microwave generator (not shown) is installed at a microwave incidence side of the waveguide 286. Also, a member configured to hold hermeticity in the process chamber 201 and simultaneously penetrate microwaves is installed at a microwave emission side of the waveguide 286. For example, a quartz member is used as this member. The microwaves configured to propagate in the waveguide 286 are supplied into the process chamber 201.

A gas introduction port 234 through which a gas is introduced is installed at a sidewall of the upper container 210. A gas supply pipe 232 configured to supply a gas is connected to the gas introduction port 234. The gas supply pipe 232 is connected to a gas cylinder (not shown) serving as a supply source of a reactive gas 230 via a valve 243a serving as an opening/closing valve and an MFC 241 serving as a flow rate controller (a flow rate control unit).

A gas exhaust port 235 serving as an exhaust port configured to exhaust a gas is installed at a sidewall of the lower container 211 so that the reactive gas 230 can be supplied from the above-described gas introduction port 234 to the process chamber 201; and the gas remaining after processing of the substrate flows from surroundings of the susceptor 217 in a bottom direction of the process chamber 201. The gas exhaust port 235 is connected to a vacuum pump 246 serving as an exhaust device via an APC 242 serving as a pressure regulator and a valve 243b serving as an opening/closing valve through a gas exhaust pipe 231 serving as an exhaust pipe configured to exhaust a gas.

Generally, a gas supply unit includes the MFC 241, the valve 243a, the gas supply pipe 232 and the gas introduction port 234. Also, a gas exhaust unit generally includes the gas exhaust port 235, the gas exhaust pipe 231, the APC 242, the valve 243b and the vacuum pump 246.

For example, the above-described magnet 283 arranged in a concentric pattern is installed as an electric discharge mechanism configured to excite the supplied reactive gas 230. The magnet 283 is installed at an upper outer portion of the process container 203 (the upper container 210), for example, installed in the order of an S pole, an N pole and an S pole from the center thereof, and arranged at an upper portion of a plasma generation region 224 generated in the process chamber 201.

The susceptor 217 serving as a substrate holding port (a substrate holding unit) configured to hold the wafer W as a substrate is arranged at a lower central portion of the process chamber 201. The susceptor 217 has a heater 217b serving as a heating mechanism (a heating unit) integrally buried therein, and thus may be configured to heat the wafer W. The heater 217b may be configured to heat the wafer W to a temperature of approximately 700° C. to 800° C. when electric power is applied to the heater 217b.

Also, an electrode-built-in susceptor (not shown) is mounted in the susceptor 217. The electrode-built-in susceptor is grounded. The electrode-built-in susceptor mounted in the above-described susceptor 217 is also included in the above-described electric discharge mechanism.

A process furnace 202 generally includes the process chamber 201, the process container 203, the susceptor 217, the magnet 283, the microwave introduction unit 285, the gas introduction port 234 and the gas exhaust port 235, and thus may plasma-process the wafer W in the process chamber 201.

A shielding box 223 configured to effectively shield a magnetic field is installed around the magnet 283 so that the magnetic field formed in the magnet 283 cannot have a negative effect on an external environment or other devices such as a process furnace.

The susceptor 217 is insulated from the grounded lower container 211, and a susceptor elevating mechanism (an elevating unit 268) configured to elevate the susceptor 217 is provided. Also, a through hole 217a is installed at the susceptor 217, and wafer elevating pins 266 configured to push up the wafer W are installed in at least three places at a bottom surface of the lower container 211. In turn, when the susceptor 217 is lowered by the susceptor elevating mechanism 268, the through hole 217a and the wafer elevating pin 266 are arranged so that the wafer elevating pins 266 can pass through the through hole 217a in a state where the wafer elevating pins 266 do not come in contact with the susceptor 217.

Also, a gate valve 244 which is an opening/closing valve is installed at a sidewall of the lower container 211, the wafer W may be loaded or unloaded with respect to the process chamber 201 by a transfer mechanism (a transfer unit, not shown) when the gate valve 244 is kept open, and the process chamber 201 may be hermetically closed when the gate valve 244 is kept closed.

Also, a controller 121 serving as a control unit is configured to control the APC 242, the valve 243b and the vacuum pump 246 through a signal line A, control the susceptor elevating mechanism 268 through a signal line B, control the gate valve 244 through a signal line C, control the MFC 241 and the valve 243a through a signal line E, and control the heater 217b, which is buried in the susceptor 217, through a signal line (not shown).

In the third example of the above-described process furnace 202, high-density plasma is obtained by interaction between microwaves and a magnetic field. In this case, electrons move spirally along a magnetic force line generated by the magnet 283, a high density of plasma is generated around the electron, and the wafer W is processed with the plasma.

The above-described process furnaces according to the first through third examples are single-type process furnaces, but the process furnace of the substrate processing apparatus according to this embodiment is not limited to the single-type process furnace. Therefore, a batch-type process furnace or a vertical process furnace may be used. Also, the present invention is not limited to a plasma process furnace, but a thermal process furnace which does not use plasma may be used.

Preferred Embodiments of the Present Invention

Hereinafter, preferred embodiments of the present invention will be additionally stated.

A first embodiment of the present invention provides a substrate processing apparatus including a load lock chamber configured to accommodate stacked substrates; a first transfer mechanism having a first transfer arm provided with a first end effector, and configured to transfer the substrates into/from the load lock chamber at a first side of the load lock chamber; a second transfer mechanism having a second transfer arm provided with a second end effector, and configured to transfer the substrates into/from the load lock chamber at a second side of the load lock chamber; a barrier installed between the substrates supported by a substrate support provided in the load lock chamber, the barrier being spaced apart from each of the substrates; and an auxiliary barrier unit installed between the substrate support and the barrier, the auxiliary barrier unit being installed in a location other than a standby spaces of the end effectors.

A second embodiment of the present invention provides the substrate processing apparatus according to the first embodiment, further including:
a first transfer chamber connected to a process chamber configured to process a substrate; and
a second transfer chamber installed at the load lock chamber,
wherein the load lock chamber is installed at the first transfer chamber,
the first transfer mechanism is installed in the first transfer chamber to perform loading and unloading of the substrate between the process chamber and the load lock chamber, and
the second transfer mechanism is installed in the second transfer chamber to perform loading and unloading of the substrate between the load lock chamber and the second transfer chamber.

A third embodiment of the present invention provides the substrate processing apparatus according to the first embodiment, further including:
a process chamber configured to process a substrate; and
a second transfer chamber installed at the load lock chamber,
wherein the load lock chamber is installed at the process chamber,
the first transfer mechanism is installed at the load lock chamber to perform loading and unloading of the substrate between the process chamber and the load lock chamber, and
the second transfer mechanism is installed in the second transfer chamber to perform loading and unloading of the substrate between the load lock chamber and the second transfer chamber.

A fourth embodiment of the present invention provides the substrate processing apparatus according to any one of the first to third embodiments, wherein a distance between the auxiliary barrier unit and the substrate accommodated directly on the auxiliary barrier unit is in a range of 0.5 mm and 2 mm.

A fifth embodiment of the present invention provides the substrate processing apparatus according to any one of the first to fourth embodiments, wherein a channel configured to flow a cooling medium is formed in the barrier.

A sixth embodiment of the present invention provides the substrate processing apparatus according to any one of the first to fifth embodiments, wherein a surface of the auxiliary barrier unit is subjected to blackened surface.

A seventh embodiment of the present invention provides the substrate processing apparatus according to any one of the first to sixth embodiments, wherein the load lock chamber is configured to be reduced in pressure.

An eighth embodiment of the present invention provides the substrate processing apparatus according to any one of the first to seventh embodiments, wherein the load lock chamber is installed on a transfer path of the substrate spanning from the process chamber to the second transfer chamber.

A ninth embodiment of the present invention provides the substrate processing apparatus according to any one of the first to eighth embodiments, wherein the substrate support is configured to support the substrate in the load lock chamber, and
a supporting surface of the substrate support configured to support the substrate at an upper side of the barrier is higher than an upper surface of the auxiliary barrier unit.

A tenth embodiment of the present invention provides the substrate processing apparatus according to any one of the first to ninth embodiments, wherein the substrate support is fixed to a wall of the load lock chamber.

An eleventh embodiment of the present invention provides the substrate processing apparatus according to any one of the first to tenth embodiments, wherein the barrier has a greater size than an external shape of the substrate.

A twelfth embodiment of the present invention provides the substrate processing apparatus according to any one of the first to eleventh embodiments, wherein a part of an external shape of the barrier has the same shape as a part of an external shape of the substrate, and
the load lock chamber includes a window configured to view a partial overlapping between the external shape of the barrier and the external shape of the substrate at a wall opposite to a front surface or a rear surface of the substrate.

A thirteenth embodiment of the present invention provides the substrate processing apparatus according to the twelfth embodiment, wherein a region of the external shape of the barrier having the same shape as the external shape of the substrate is arranged in a symmetric position with respect to the center of the substrate placed in the load lock chamber.

A fourteenth embodiment of the present invention provides the substrate processing apparatus according to the twelfth or thirteenth embodiment, wherein the window is arranged in a position corresponding to the region of the external shape of the barrier having the same shape as the external shape of the substrate.

A fifteenth embodiment of the present invention provides the substrate processing apparatus according to any one of the first to fourteenth embodiments, including:
a gas supply system configured to supply nitrogen to the load lock chamber;
a vacuum pump connected to the load lock chamber via a main exhaust valve and a slow exhaust valve parallel to each other; and
a control unit configured to control the main exhaust valve and the slow exhaust valve,
wherein the control unit is configured to instruct execution of a vacuum intake sequence of the load lock chamber including a first step of closing the main exhaust valve, opening the slow exhaust valve and exhausting an atmosphere in the load lock chamber using the vacuum pump; and a second step of opening the main exhaust valve, closing the slow exhaust valve, exhausting an atmosphere in the load lock chamber using the vacuum pump after a pressure in the load lock chamber reaches a predetermined pressure, and reducing the pressure in the load lock chamber to a predetermined pressure, and control to supply nitrogen gas into the load lock chamber using the gas supply system from the beginning of the first step to the end of the second step.

A sixteenth embodiment of the present invention provides the substrate processing apparatus according to any one of the first to fifteenth embodiments, wherein an upper lid of the vacuum transfer chamber is configured so that an opening/closing direction can be set freely.

What is claimed is:

1. A substrate processing apparatus comprising:
a load lock chamber configured to accommodate a substrate support supporting stacked substrates including at least a first substrate and a second substrate;
a first transfer mechanism having a first transfer arm provided with a first end effector having two fingers at a front end thereof, and configured to transfer the stacked substrates into/from the load lock chamber at a first side of the load lock chamber;
a second transfer mechanism having a second transfer arm provided with a second end effector having two fingers at a front end thereof, and configured to transfer the stacked substrates into/from the load lock chamber at a second side of the load lock chamber;
a barrier installed between the stacked substrates supported by the substrate support provided in the load lock chamber, the barrier being spaced apart from each of the stacked substrates; and
an auxiliary barrier unit disposed between the barrier and one of the stacked substrates without vertically overlapping the substrate support and a standby space of the first end effector, the auxiliary barrier unit being disposed about a center portion of the one of the stacked substrates supported by the substrate support and configured to absorb heat radiated from the one of the stacked substrates,
wherein the auxiliary barrier unit has a blackened surface to increase absorption of heat, and the barrier has therein a channel where a cooling medium flows and is configured to absorb heat of the auxiliary barrier unit absorbing radiant heat radiated from the stacked substrates.

2. The substrate processing apparatus of claim 1, wherein a supporting surface of the substrate support supporting the one of the stacked substrates above the barrier is higher than an upper surface of the auxiliary barrier unit.

3. The substrate processing apparatus of claim 2, wherein an area of the barrier is greater than those of the stacked substrates.

4. The substrate processing apparatus of claim 1, wherein an area of the barrier is greater than those of the stacked substrates.

5. The substrate processing apparatus of claim 1, wherein the substrate support comprises:
a lower substrate support disposed below the barrier and supporting the first substrate after a process for the first substrate is complete; and
an upper substrate support disposed above the barrier and supporting the second substrate while the lower substrate supports the first substrate after a process for the second substrate is complete,
wherein the load lock chamber is connected to a gas introduction system and a gas exhaust system, and
wherein the auxiliary barrier unit is disposed between the barrier and the second substrate supported by the upper substrate support.

6. The substrate processing apparatus of claim 1, wherein the substrate support comprises:
a lower substrate support disposed below the barrier and supporting the first substrate after a process for the first substrate is complete; and
an upper substrate support disposed above the barrier and supporting the second substrate while the lower substrate supports the first substrate after a process for the second substrate is complete,
wherein the load lock chamber is connected to a gas supply system and a gas exhaust system.

7. A substrate processing apparatus comprising:
a load lock chamber configured to accommodate a substrate support supporting at least two vertically stacked substrates;
a first transfer mechanism having a first transfer arm provided with a first end effector with two fingers, and configured to load and unload one of the at least two vertically stacked substrates into and from the load lock chamber at a first side of the load lock chamber;
a second transfer mechanism having a second transfer arm provided with a second end effector, and configured to load and unload another one of the at least two vertically stacked substrates into and from the load lock chamber at a second side of the load lock chamber;
a barrier installed between the one of the at least two vertically stacked substrates supported by an upper side of the substrate support and the another one of the at least two vertically stacked substrates supported by a lower side of the substrate support accommodated in the load lock chamber, the barrier being spaced apart from the one of the at least two vertically stacked substrates and the another one of the at least two vertically stacked substrates; and
an auxiliary barrier unit disposed above the barrier to face a back surface of the one of the at least two vertically stacked substrates without vertically overlapping the substrate support and a standby space of the first end effector, the auxiliary barrier unit being disposed about a center portion of the one of the at least two vertically stacked substrates and configured to absorb heat radiated from the one of the at least two vertically stacked substrates, wherein the auxiliary barrier unit has a blackened surface to increase absorption of heat, and the barrier has therein a channel where a cooling medium flows and is configured to absorb heat of the auxiliary barrier unit absorbing radiant heat radiated from the stacked substrates.

8. The substrate processing apparatus of claim 7, wherein the substrate support supports the one of the at least two vertically stacked substrates at a height higher than that of an upper surface of the auxiliary barrier unit.

9. The substrate processing apparatus of claim 8, wherein an area of the barrier is greater than that of each of the at least two vertically stacked substrates.

10. The substrate processing apparatus of claim 7, further comprising a bottom auxiliary barrier unit installed under the another one of the at least two vertically stacked substrates accommodated in the load lock chamber.

11. The substrate processing apparatus of claim 7, wherein a part of an external shape of the barrier is same shape as a part of an external shape of each of the at least two vertically stacked substrates in planar view of the load lock chamber.

12. The substrate processing apparatus of claim 7, wherein the auxiliary barrier unit is installed separately from the barrier.

13. The substrate processing apparatus of claim 7, wherein a distance between the auxiliary barrier unit and the stacked substrates accommodated directly on the auxiliary barrier unit ranges from 0.5 mm to 2 mm.

14. A substrate processing apparatus comprising:
a load lock chamber accommodating a substrate support fixed to a bottom thereof, the substrate support supporting at least two vertically stacked substrates;
a first transfer mechanism having a first transfer arm provided with a first end effector with bipartite front end, and configured to load and unload one of the at least two vertically stacked substrates into and from the load lock chamber at a first side of the load lock chamber;
a second transfer mechanism having a second transfer arm provided with a second end effector with bipartite front end, and configured to load and unload another one of the at least two vertically stacked substrates into and from the load lock chamber at a second side of the load lock chamber;
a barrier installed between the at least two vertically stacked substrates supported by the substrate support in the load lock chamber, the barrier being spaced apart from the at least two vertically stacked substrates and having an area larger than that of the at least two vertically stacked substrates, wherein a shape of a portion of an outer circumference of the barrier is the same as that of the at least two vertically stacked substrates;
an end effector standby space disposed between the barrier and the substrate support where the first end effector is in standby position when the substrate support supports the one of the at least two vertically stacked substrates, the end effector standby space being disposed in a more central position of the load lock chamber than the substrate support; and
an auxiliary barrier unit disposed between the bipartite front end of the first end effector when the first end effector is in standby position, and configured to absorb heat radiated from the one of the at least two vertically stacked substrates,
wherein the barrier includes therein a channel where a cooling medium flows and configured to block heat transfer between the at least two vertically stacked substrates and to absorb heat from the auxiliary barrier unit absorbing radiant heat radiated from the stacked substrates, and wherein the auxiliary barrier unit includes therein a channel where a cooling medium flows.

15. The substrate processing apparatus of claim 14, wherein the auxiliary barrier unit includes a blackened surface to increase absorption of heat.

16. The substrate processing apparatus of claim 14, further comprising a lower auxiliary barrier unit disposed between the bipartite front end of the second end effector when the second end effector is in standby position, and configured to absorb heat radiated from the another one of the at least two vertically stacked substrates.

17. The substrate processing apparatus of claim 14, wherein the load lock chamber comprises a window at a ceiling thereof, the window being disposed at a position where a partial overlapping of an external shape of the barrier and an external shape of the at least two vertically stacked substrates is viewed.

* * * * *